US009274715B2

(12) United States Patent
Chun et al.

(10) Patent No.: US 9,274,715 B2
(45) Date of Patent: Mar. 1, 2016

(54) METHODS AND APPARATUSES FOR IN-SYSTEM FIELD REPAIR AND RECOVERY FROM MEMORY FAILURES

(71) Applicant: QUALCOMM Incorporated, San Diego, CA (US)

(72) Inventors: Dexter T. Chun, San Diego, CA (US); Jungwon Suh, San Diego, CA (US); Stephen A. Molloy, Carlsbad, CA (US); Jung Pill Kim, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 134 days.

(21) Appl. No.: 13/957,476

(22) Filed: Aug. 2, 2013

(65) Prior Publication Data

US 2015/0039848 A1 Feb. 5, 2015

(51) Int. Cl.

| | |
|---|---|
| ***G06F 12/10*** | (2006.01) |
| ***G06F 3/06*** | (2006.01) |
| ***G06F 11/10*** | (2006.01) |
| ***G11C 16/34*** | (2006.01) |
| *G06F 12/02* | (2006.01) |

(52) U.S. Cl.

CPC ............ *G06F 3/0638* (2013.01); *G06F 3/0617* (2013.01); *G06F 3/0683* (2013.01); *G06F 11/1048* (2013.01); *G11C 16/34* (2013.01); *G06F 12/0215* (2013.01)

(58) Field of Classification Search

None

See application file for complete search history.

(56) References Cited

U.S. PATENT DOCUMENTS

| | | | | |
|---|---|---|---|---|
| 6,199,139 | B1 * | 3/2001 | Katayama et al. | 711/106 |
| 6,446,184 | B2 | 9/2002 | Dell et al. | |
| 6,704,230 | B1 * | 3/2004 | DeBrosse et al. | 365/201 |
| 7,099,221 | B2 | 8/2006 | Klein | |
| 8,161,334 | B1 | 4/2012 | Hulbert et al. | |
| 8,239,729 | B2 | 8/2012 | Borchers et al. | |
| 8,489,942 | B1 | 7/2013 | Wong et al. | |
| 2005/0081114 | A1 * | 4/2005 | Ackaret et al. | 714/42 |
| 2009/0276602 | A1 * | 11/2009 | Chedru | 711/171 |
| 2010/0332894 | A1 | 12/2010 | Bowers et al. | |
| 2010/0332895 | A1 * | 12/2010 | Billing et al. | 714/8 |
| 2012/0059972 | A1 | 3/2012 | Chen | |
| 2012/0151299 | A1 * | 6/2012 | Suh | 714/764 |
| 2012/0221902 | A1 | 8/2012 | Ware et al. | |
| 2012/0278651 | A1 * | 11/2012 | Muralimanohar et al. | 714/6.11 |
| 2014/0075265 | A1 * | 3/2014 | Hung et al. | 714/763 |
| 2014/0189229 | A1 * | 7/2014 | Schoenborn et al. | 711/106 |

OTHER PUBLICATIONS

International Search Report and Written Opinion for International Application No. PCT/US2014/047435, ISA/EPO, Date of Mailing Oct. 8, 2014, 9 pages.

* cited by examiner

*Primary Examiner* — Duc Doan

(74) *Attorney, Agent, or Firm* — Toler Law Group, PC

(57) ABSTRACT

In a particular embodiment, a device includes memory address remapping circuitry and a remapping engine. The memory address remapping circuitry includes a comparison circuit to compare a received memory address to one or more remapped addresses. The memory address remapping circuitry also includes a selection circuit responsive to the comparison circuit to output a physical address. The physical address corresponds to a location in a random-access memory (RAM). The remapping engine is configured to update the one or more remapped addresses to include a particular address in response to detecting that a number of occurrences of errors at a particular location satisfies a threshold.

52 Claims, 10 Drawing Sheets

METHODS AND APPARATUSES FOR IN-SYSTEM FIELD REPAIR AND RECOVERY FROM MEMORY FAILURES

I. FIELD

The present disclosure is generally related to in-system field repair and recovery from memory failures.

II. DESCRIPTION OF RELATED ART

Advances in technology have resulted in smaller and more powerful computing devices. For example, there currently exists a variety of portable personal computing devices, including wireless computing devices, such as portable wireless telephones, tablet computers, and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

As technology improves, memory devices, such as a random-access memory (RAM), continue to be scaled down in size. As the memory devices scale down, cell capacitance and cell transistor leakage of the memory devices increase and an amount of cell retention time is reduced. Additionally, memory devices may include latent manufacturing defects that may manifest during use and result in errors as data is read from memory arrays of the memory devices.

To account for reduced cell retention time and for errors, some memory devices have included error-correcting circuitry (ECC) to detect and correct bit errors. However, because errors can increase over time, the cost of including hardware to correct the errors that manifest over time becomes expensive. Other memory devices have implemented a frequent refresh of cells of the memory to maintain data in memory cells. However, frequent refreshing can lead to an overall increase in power consumption and a reduction in bus performance of the memory devices.

III. SUMMARY

A system may include a host device that identifies an error associated with a page (e.g., a failing page) of a memory device and remaps an address associated with the page to point to a different page of the memory device. When an error associated with a particular address (e.g., an address of a page) is identified by a memory device, such as a random-access memory (RAM) device, error data associated with a location of the error may be received by a host device. The host device may determine that an occurrence of errors in data read at a location based on the particular address satisfies a threshold and may map (e.g., remap) the particular address to access a different location (e.g., a different page) of the memory device. The remapping may be transparent to an operating system of the host device. The operating system may treat the memory device as a contiguous memory space regardless of whether one or more addresses have been remapped.

In a particular embodiment, a device includes memory address remapping circuitry and a remapping engine. The memory address remapping circuitry includes a comparison circuit to compare a received memory address to one or more remapped addresses. The memory address remapping circuitry also includes a selection circuit responsive to the comparison circuit to output a physical address. The physical address corresponds to a location in a random-access memory (RAM). The remapping engine is configured to update the one or more remapped addresses to include a particular address in response to detecting that a number of occurrences of errors in data read from a particular location based on the particular address satisfies a threshold.

In another particular embodiment, a method includes outputting a physical address responsive to a comparison between a received memory address and at least one remapped address. The physical address corresponds to a location in a random-access memory (RAM). The method further includes updating remapping information to identify a particular address in response to a number of occurrences of errors in data read from a particular location based on the particular address satisfying a threshold.

In a further particular embodiment, an apparatus includes means for outputting a physical address responsive to a comparison between a received memory address and at least one remapped address of one or more remapped addresses. The physical address corresponds to a location in a random-access memory (RAM). The apparatus also includes means for updating remapping information to identify a particular address in response to a number of occurrences of errors in data read from a particular location based on the particular address satisfying a threshold.

In another particular embodiment, a non-transitory computer readable medium includes instructions that, when executed by a processor, cause the processor to output a physical address responsive to comparing a received memory address to at least one remapped address. The physical address corresponds to a location in a random-access memory (RAM). The instructions further cause the processor to update remapping information to identify a particular address in response to a number of occurrences of errors in data read from a particular location based on the particular address satisfying a threshold.

In another particular embodiment, a dynamic random-access memory (DRAM) device includes a memory comprising a plurality of pages. The DRAM device further includes an error-correcting code (ECC) engine configured to detect errors associated with one or more pages of the plurality of pages. The DRAM device also includes a mode register accessible to a host device via a host interface. An address of data read from the memory is stored in the mode register based on the ECC engine detecting that the data includes an error. The mode register is readable by a host to perform page address remapping.

In another particular embodiment, a method includes detecting that data read from a memory includes an error, the memory comprising a plurality of pages. The method further includes storing an address of the data in a mode register based on detection of the error included in the data read from the memory. The mode register is accessible to a host device configured to perform page address remapping.

One particular advantage provided by at least one of the disclosed embodiments is that as errors occur in the memory device, the host device remaps addresses to avoid using possibly failing portions (e.g., failed pages) of the memory device. Errors may be reduced by avoiding failing portions (e.g., failed pages) of the memory. Thus, certain errors that occur in the memory device may be avoided and a life span of the memory device may be increased by avoiding failing pages.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Particular embodiments of the present disclosure are described below with reference to the drawings. In the description, common features are designated by common reference numbers throughout the drawings.

Figure 1:
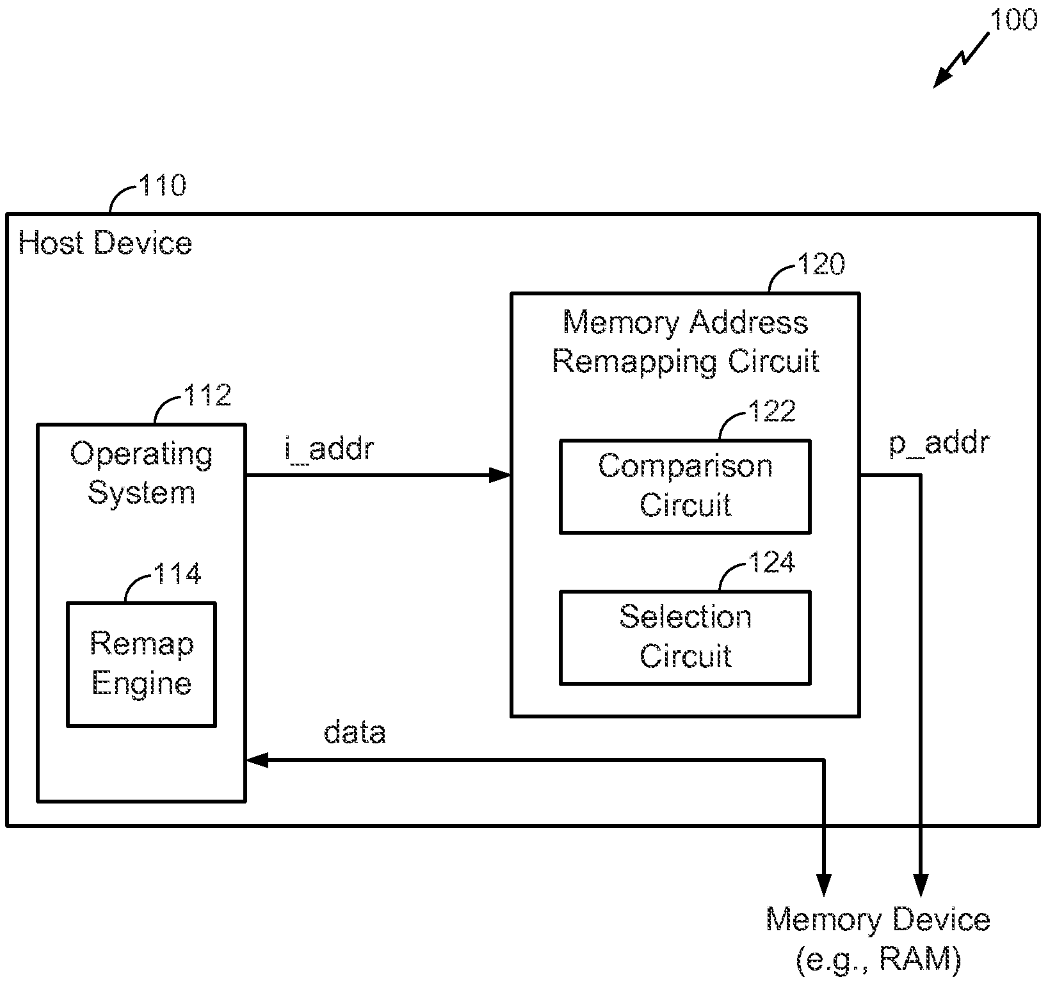
FIG. 1 is a block diagram of a first illustrative embodiment of a host device that includes a memory address remapping circuit.

Referring to FIG. 1, a system 100 includes a memory address remapping circuit to remap addresses. The system 100 includes a host device 110 that is communicatively coupled to one or more memory devices (not shown). For example, the host device 110 and the memory device may communicate via a bus. The memory device may include a memory (e.g., a memory array), such as a random-access memory (RAM) including a dynamic random-access memory (DRAM), a static random-access memory (SRAM), or a magnetoresistive random-access memory (MRAM). A particular embodiment of a memory device is described with reference to FIG. 4.

The host device 110 includes an operating system 112 and a memory address remapping circuit 120. The operating system 112 may execute one or more applications or programs associated with the host device 110. For example, the operating system 112 may be implemented by a processor and one or more memories each storing processor executable instructions that may be executed by the processor. The operating system 112 may access the memory device by providing an intermediate address (i_addr) to the memory address remapping circuit 120. The operating system 112 may include a remapping engine 114 that is configured to generate and to update one or more remapped addresses to include a particular address, as described further herein. For example, the remapping engine 114 may generate remapping information that identifies a remapped intermediate address (i_addr) and designates a corresponding physical address (p_addr) to which the remapped intermediate address (i_addr) is mapped.

The memory address remapping circuit 120 may map (e.g., translate) the intermediate address (i_addr) to a physical address (p_addr) that is provided to the memory device. The memory address remapping circuit 120 may include a comparison circuit 122 and a selection circuit 124, as described further with reference to FIG. 2. The comparison circuit 122 may be configured to compare a received memory address, such as an intermediate address (i_addr), to one or more remapped addresses. For example, the memory address remapping circuit 120 may store (e.g., be programmed with) the one or more remapped addresses. The one or more remapped addresses may be provided to the memory address remapping circuit 120 when (e.g., in response to) the operating system 112 being booted, such as upon power-up of the host device 110. For example, the remapping engine 114 may request remapping information, such as one or more remapped addresses, to be loaded into the memory address remapping circuit 120 during the boot process. Based on the received memory address (e.g., the intermediate address (i_addr), the selection circuit 124 may be configured to output a corresponding physical address (p_addr). The corresponding physical address (p_addr) may be associated with (e.g., identify) a location in the memory device.

The operating system 112 may receive data from the memory device based on a particular physical address (p_addr). The memory device may include a memory having pages, a portion of which are reserved/remapped pages, as described further with reference to FIGS. 4 and 5. The memory device may access a particular location of the memory based on the particular physical address (p_addr) and may provide data stored at the particular location to the host device 110.

During the access to the particular location of the memory based on the particular physical address (p_addr), an error-correcting code (ECC) engine associated with the memory device may detect one or more errors associated with the accessed data, as described with reference to FIG. 4. The ECC engine may correct the one or more errors in order to provide the host device 110 with data that is valid. As part of correcting the one or more errors, the ECC engine may identify error data, such as an address (e.g., a column and a row), corresponding to the error. Accordingly, the error data may represent an occurrence of the one or more errors in data read from the particular location at the particular physical address (p_addr) of the memory (e.g., based on a particular intermediate address (i_addr) that maps to the particular physical address (p_addr)). The error data may be provided to the host device 110 from the memory device. For example, the error data may be included with data from the particular location based on the particular physical address (p_addr). As another example, the error data may be stored in a mode register of the memory device that is accessible to the host device 110.

The host device 110 may receive the data based on the particular physical address (p_addr) and the error data from the memory device. For example, the host device 110 may periodically poll the mode register of the memory device to determine whether the mode register includes error data. As another example, the host device 110 may pull the error data from the mode register in response to receiving an error flag included with the data that is based on the particular physical address (p_addr).

The remapping engine 114 may receive the error data and may generate or update a log of error data information based on the error data. For example, for particular error data, the remapping engine 114 may generate an entry in the log of error data information to record the particular error data and a time associated with reception of the particular error data. The remapping engine 114 may generate the log of error data information in a non-volatile memory associated with the host device 110 that includes error information, as described with reference to FIG. 3. In a particular embodiment, the log of error data information may include error data (e.g., error data received from the memory device) and a time (e.g., a reception time) associated with the error data.

The remapping engine 114 may determine that a number of occurrences of errors in data read from a particular location based on a particular address (e.g., a page address associated with the memory device) satisfies a threshold. The number of occurrences of errors may be based on the log of error data information. Accordingly, the number of occurrences of errors may be associated with one or more data read operations and may be associated with a number of consecutive errors based on the particular address, a count of errors based on the particular address, a count of a number of errors based on the particular address during a time period, or a combination thereof. For example, based on the log of error data information including the error data, the threshold may be satisfied when multiple consecutive errors are each based on the particular address. In a particular embodiment, three consecutive errors satisfy the threshold. As another example, the remapping engine 114 may determine a count of errors that correspond to data accessed based on the particular address. Accordingly, the threshold may be satisfied based on the count of errors (e.g., when three errors out of fifty received errors are based on the particular address or when a total of five errors are based on the particular address). As another example, the remapping engine 114 may count a number of received errors associated with a particular memory location (or page) of the memory within a time period. Accordingly, the threshold may be satisfied based on the number of errors within the time period satisfying the threshold.

When the threshold is satisfied, the remapping engine 114 may remap an intermediate address (i_addr) that corresponds to the particular address of the memory device to a different address, such as by remapping a particular page address (e.g., a first physical address) to a different page address (e.g., a second physical address). To remap an intermediate address (i_addr), the remapping engine 114 may track the pages of the memory. For example, the remapping engine 114 may track a set of the pages of the memory device identified as bad (e.g., faulty), reserved, or remapped, as described with reference to FIG. 5.

The remapping engine 114 may generate remapping information to remap the intermediate address (i_addr) to a different corresponding physical address. The remapping information may identify a particular intermediate address (i_addr) to be remapped and designate (identify) a corresponding physical address (p_addr). The particular intermediate address (i_addr) may be identified in the remapping information by at least a portion of the particular intermediate address (i_addr). The corresponding physical address (p_addr) may be designated in the remapping information as at least a portion of the corresponding physical address (p_addr) or as an offset from the intermediate address (i_addr) that is being remapped. The remapping engine 114 may cause the remapping information to be stored in an address map of a non-volatile memory external to or included in the host device 110, as described with reference to FIG. 3. Alternatively or in addition to, the remapping engine 114 may update, using the remapping information, a remapped intermediate address (i_addr) previously stored in the address map with a different corresponding physical address (p_addr). In the event that the host device 110 loses power, the non-volatile memory including the address map retains remapping information that identifies one or more intermediate addresses (i_addr) (e.g., one or more remapped intermediate addresses) and corresponding physical addresses. In addition to storing the remapped address at the nonvolatile memory, the remapping engine 114 may also cause one or more remapped addresses used by the memory address remapping circuit 120 to be stored or updated at the memory address remapping circuit 120. The remapping engine 114 may be configured to select a reserved address associated with the memory to be used as the corresponding physical address when the particular address (e.g., the intermediate address (i_addr)) corresponds to a physical page that has an occurrence of errors that satisfies the threshold.

During operation of the system 100, remapping information, such as one or more remapped addresses, may be loaded into or otherwise provided to the memory address remapping circuit 120. After the memory address remapping circuit 120 receives the one or more remapped addresses, the operating system 112 may request access to one or more locations included in the memory device. For example, the operating system 112 may send an intermediate address (i_addr) to the memory address remapping circuit 120. The memory address remapping circuit 120 may output a physical address (p_addr) corresponding to the intermediate address (i_addr) based on a comparison between the intermediate address (i_addr) and the one or more remapped addresses.

Data corresponding to the physical address (p_addr) may be provided to the host device 110 from the memory device. When the memory device identifies an error associated with the data, the ECC engine associated with the memory device may correct the error (to return valid data) and may generate error heuristic data to be provided to the host device 110.

The host device 110 may receive the error data and populate a log associated with the error data. Based on the log of error data information, the remapping engine 114 may determine that a portion (e.g., a byte, a word, or a page, as illustrative examples) of the memory is bad. When the remapping engine 114 determines that the portion of the memory is bad, the remapping engine 114 may map (e.g., remap) an intermediate address (i_addr) corresponding with the portion to a different portion (corresponding to the remapped intermediate address) of the memory that is reserved for remapping. If the intermediate address (i_addr) is being remapped for a first time (e.g., the intermediate address (i_addr) is not identified as a remapped intermediate address by the memory address remapping circuit 120), the remapping engine 114 may identify the intermediate address (i_addr) as remapped and designate a corresponding physical page (p_page) to which the remapped intermediate address (i_addr) is mapped. For example, the remapping engine 114 may generate and store an identifier associated with the intermediate address (i_addr) being remapped.

If the intermediate address (i_addr) was previously identified as a remapped intermediate address (i_addr), the remapping engine 114 may update the remapped intermediate address (i_addr) to correspond to a different physical address (p_addr). The remapping engine 114 may update the memory address remapping circuit 120 and an address map stored in the non-volatile memory to reflect the intermediate address (i_addr) being remapped.

By tracking one or more errors that occur at the memory device, the host device 110 is able to identify and avoid error-prone or "bad" locations of the memory. Accordingly, by remapping one or more intermediate addresses (i_addr) when bad locations are identified, the operating system 112 may treat the memory device as a contiguous storage space even though a non-contiguous storage space is used as a result of remapping to avoid use of one or more bad locations. By avoiding use of bad locations of the memory device, an amount of errors associated with the memory device may be limited because locations in the memory device known to result in errors are not used.

Figure 2:
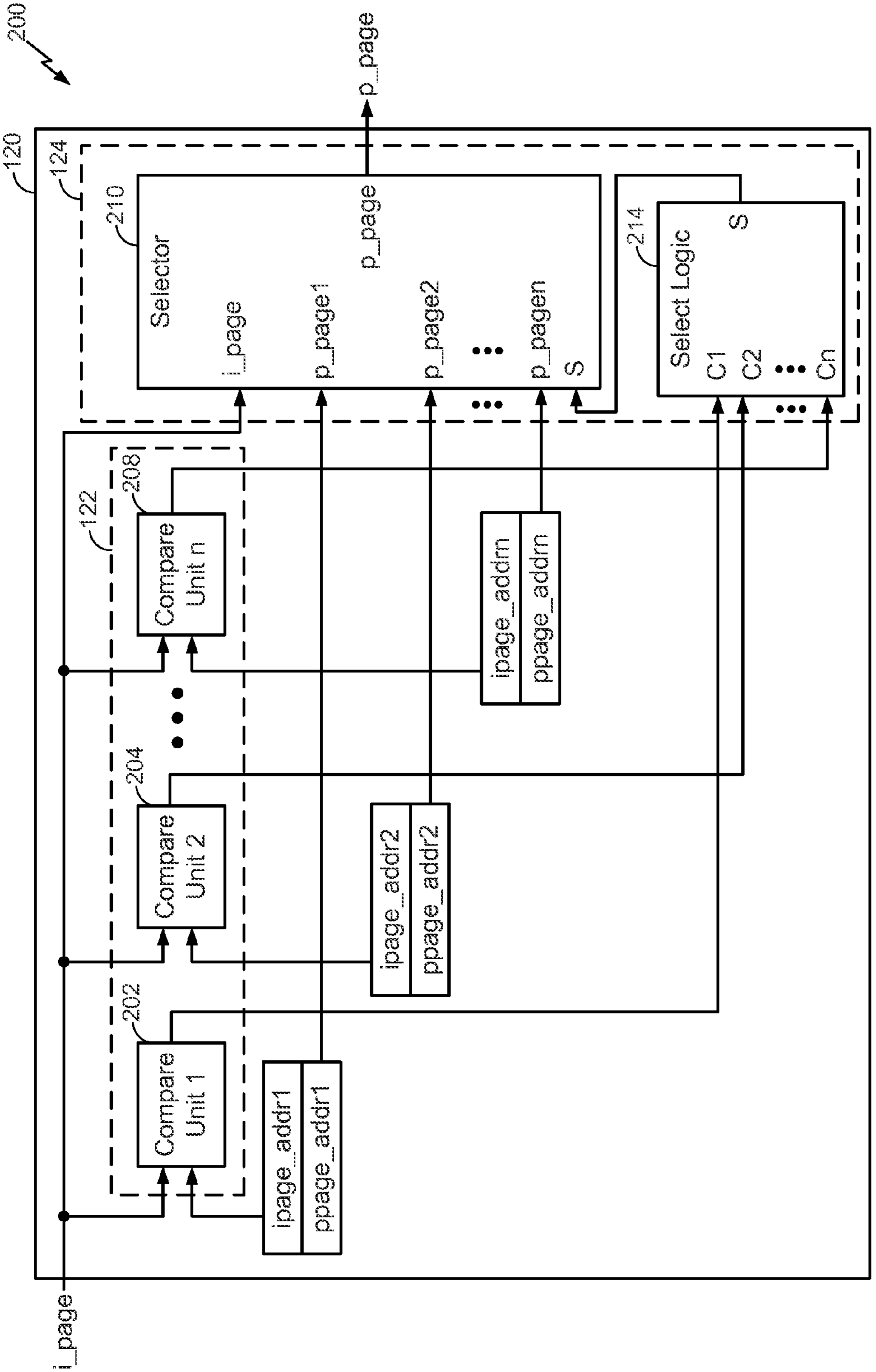
FIG. 2 is a block diagram of an illustrative embodiment of the memory address remapping circuit of the host device of FIG. 1.

Referring to FIG. 2, a particular embodiment of the memory address remapping circuit 120 is shown and designated 200. The comparison circuit 122 includes a plurality of compare units 202-208 (e.g., exclusive OR gates) and the selection circuit 124 includes select logic 214 and a selector 210 (e.g., a multiplexer). For example, the plurality of compare units 202-208 may include a first compare unit 202, a second compare unit 204, and an nth compare unit 208. Although three compare units 202-208 are shown, the comparison circuit 122 may include fewer than three compare units or more than three compare units.

The memory address remapping circuit 120 is provided with remapping information associated with one or more remapped addresses. For example, the remapping information may identify an intermediate page address (ipage_addr1-ipage_addrn) (e.g., a remapped intermediate page address) and a corresponding physical page address (ppage_addra-ppage_addrn) to which the intermediate page address (ipage-_addr1-ipage_addrn) has been remapped. In a particular embodiment, the one or more remapped addresses may include a first address remapping from a first intermediate page address (ipage_addr1) to a first physical page address (ppage_addr1), a second address remapping from a second intermediate page address (ipage_addr2) to a second physical page address (ppage_addr2), and a third address remapping from a third intermediate page address (ipage_addrn) to a third physical page address (ppage_addr2). Although three address remappings are shown, the comparison circuit 122 may be associated with fewer than three address remappings or more than three address remappings. The intermediate page address (ipage_addr1-ipage_addrn) and the corresponding physical page address (ppage_addr1-ppage_addrn) may be stored in the memory address remapping circuit 120 in a random access memory or in one or more registers.

The memory address remapping circuit 120 may receive a particular intermediate page address (i_page) and the compare units 202-208 may compare the particular intermediate page address (i_page) to each identified intermediate page address (ipage_addr1-ipage_addrn). For example, the first compare unit 202 may compare the intermediate page address (i_page) to the first intermediate page addresses (ipage_addr1), the second compare unit 204 may compare the intermediate page address (i_page) to the second intermediate page addresses (ipage_addr2), and the nth compare unit 208 may compare the intermediate page address (i_page) to the third intermediate page addresses (ipage_addrn).

If none of the compare units 202-208 identify a match (e.g., indicating that the particular intermediate page address (i_page) has not been remapped to a different physical page), the selector 210 may output a physical page address (p_page) that corresponds to the particular intermediate page address (i_page). For example, the selector 210 may output the particular intermediate page address (i_page) as the physical page address (p_page). If there is a match, a particular compare unit 202, 204, 208 that identified (e.g., determined) the match may provide a signal to the select logic 214. The select logic 214 (e.g., a select logic circuit) may provide an output (S) to the selector 210 to enable the selector 210 (e.g., a selector circuit) to select a particular physical page address (ppage_addr1-ppage_addrn) that corresponds to the intermediate page addresses (ipage_addr1-ipage_addrn) that matched the particular intermediate page (i_page). The selector 210 may then output the corresponding physical page address (ppage_addr1-ppage_addrn) as the particular physical page address (p_page) that corresponds to the particular intermediate address (i_page). Accordingly, the selection circuit 124 may output the physical page address (p_page) responsive to the comparison circuit 122.

A comparison of the particular intermediate page address (i_page) to one of the stored intermediate page address(es) (ipage_addr1-ipage_addrn) may include comparing a portion of the particular intermediate page address (i_page) received by the memory address remapping circuit 120 to a corresponding portion to the stored intermediate page address (ipage_addr1-ipage_addrn). For example, when the full intermediate page address is 35 bits and the page remapping is performed using a 4 kilobyte granularity, the comparison may be based on an upper 23 bits of the particular intermediate page address (i_page). In a particular embodiment, each intermediate page address (ipage_addr1-ipage_addrn) only includes the upper bits. By comparing a portion (e.g., upper bits) of the particular intermediate page address (i_page), the comparison may be performed more quickly and/or using less hardware (e.g., resulting in less power consumption) than if the entire particular intermediate page address (i_page) were compared.

Figure 3:
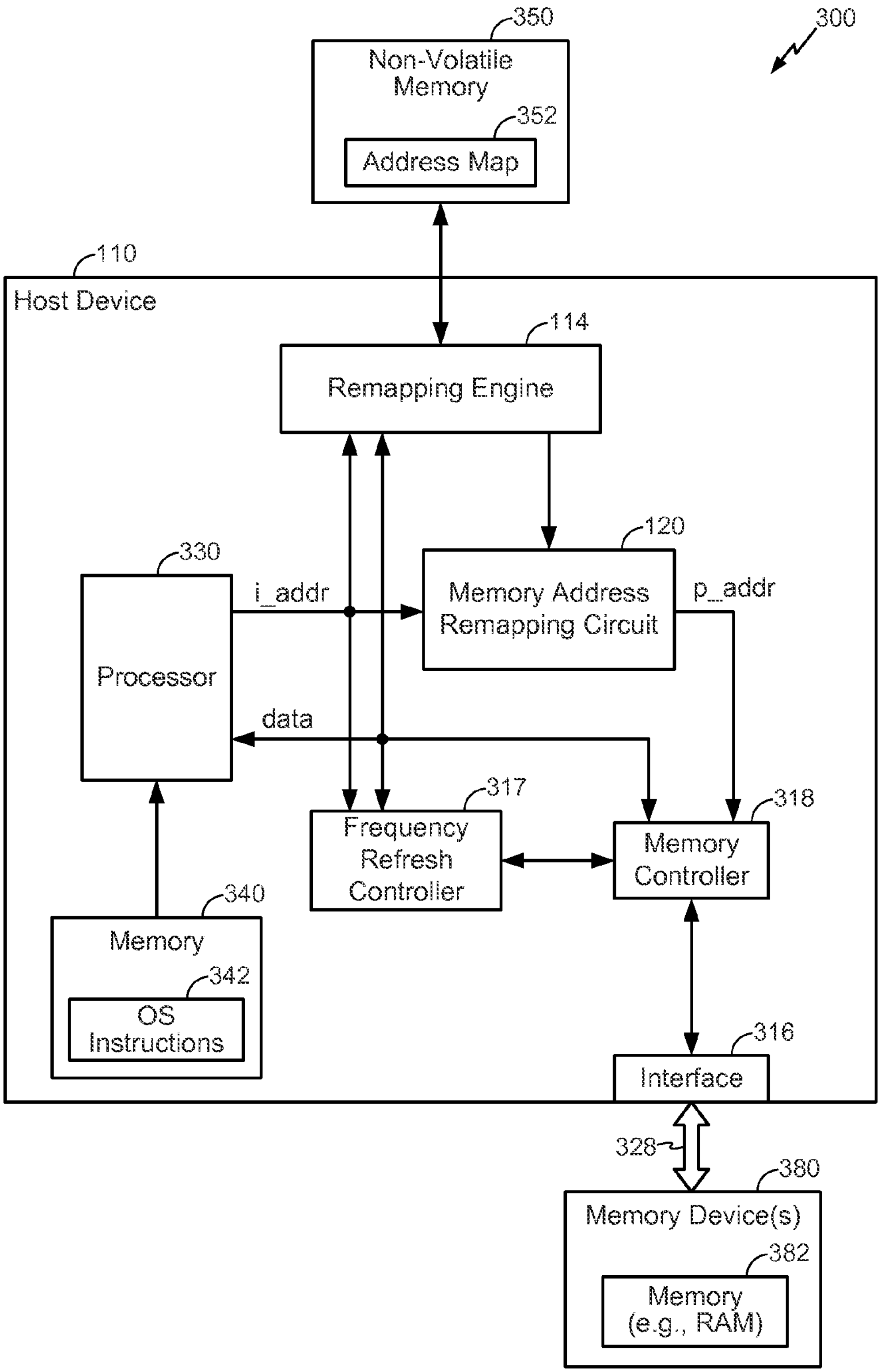
FIG. 3 is a block diagram of a system that includes a host device having a memory address remapping circuit.

Referring to FIG. 3, a system 300 having a memory address remapping circuit to remap addresses is shown. The system 300 includes the host device 110 of FIG. 1, a non-volatile memory 350, and a memory device 380. The host device 110 may be communicatively coupled to the non-volatile memory 350 and to the memory device 380. For example, the host device 110 may be coupled to the memory device 380 via a bus 328. The memory device 380 may include a memory 382, such as such as random-access memory (RAM) including a dynamic random-access memory (DRAM), a static random-access memory (SRAM), or a magnetoresistive random-access memory (MRAM). Although the host device 110 is depicted as being coupled to one memory device in FIG. 2, the host device 110 may be coupled to a plurality of memory devices via one or more buses. For example, the host device 110 may be coupled to the plurality of memories via the bus 328.

The host device 110 may include one or more components, such as a memory 340, a processor 330, a frequency refresh controller 317, a memory controller 318, the interface 316, the remapping engine 114, and the memory address remapping circuit 120. The one or more components of the host device 110 may be included in a system on a chip. Alternatively, one or more of the components, such as the remapping engine 114, may be external to the host device 110.

The memory 340 may include operating system (OS) instructions 342 executable by the processor 330. The memory 340 may include a volatile memory or a non-volatile memory. For example, when the memory 340 is a volatile memory, the OS instructions 342 may be loaded (e.g., booted) into the memory 340 from a non-volatile memory (e.g., the non-volatile memory 350) when the host device 110 is activated (e.g., turned on).

The processor 330 may execute one or more applications or programs associated with the host device 110. The processor 330 may represent a single processor or multiple processors. The processor 330 may include one or more caches or register to store (e.g., temporarily store) data. The processor 330 may access or request access to the memory device 380 by providing an intermediate address (i_addr) to the memory address remapping circuit 120.

The host device 110 may be coupled to the non-volatile memory 350. Although the non-volatile memory 350 is depicted as external to the host device 110, the non-volatile memory 350 may be included in the host device 110. The non-volatile memory 350 may include an address map 352 that stores remapping information. In a particular embodiment, the address map 352 includes a data structure (e.g., a table) that identifies and maps each of one or more remapped intermediate addresses (i_addr) to a corresponding physical address (p_addr). The address map 352 may be populated and updated by the remapping engine 114.

The remapping engine 114 may request remapping information associated with one or more remapped addresses to be loaded into the memory address remapping circuit 120. The remapping engine 114 may request the remapping information to be loaded in response to the host device 110 being activated (e.g., turned on or waking from a sleep mode) or from an operating system, such as the operating system 112 of FIG. 1, being booted. The remapping engine 114 may be included in one or more other components of host device 110. For example, the remapping engine 114 may be included in one of the processor 330, the frequency refresh controller 317, or the memory controller 318. In a particular embodiment, the remapping engine 114 includes a memory controller of the non-volatile memory 350.

The remapping information may be provided from the non-volatile memory 350 directly to the memory address remapping circuit 120 or via one or more components, such as the remapping engine 114, of the host device 110. After the memory address remapping circuit 120 receives the remapping information, the processor 330 may access the memory device by generating an access request that includes an intermediate address (i_addr) that is received by the memory address remapping circuit 120. The memory address remapping circuit 120 may output one or more physical addresses (p_addr), as described with reference to FIGS. 1 and 2.

The one or more physical addresses (p_addr) may be received by the memory controller 318. The memory controller 318, such as a RAM controller, may receive the physical address(es) (p_addr) from the memory address remapping circuit 120 and may access the memory device 380, via the interface 316 and the bus 328, based on the one or more physical addresses (p_addr). The memory device 380 may access a particular location of the memory 382 based on a particular physical address (p_addr) and may provide data stored at the location to the processor 330 via the memory controller 318. The memory device 380 may include the memory 382. The memory 382 may include multiple pages, a portion of which are reserved/remapped pages, as described further with reference to FIGS. 4 and 5.

During the access of the location of the memory 382 based on the physical address, an error-correcting code (ECC) engine associated with the memory device 380 may detect one or more errors associated with the access, as described with reference to FIG. 4. The ECC engine may correct the one or more errors in order to provide the host device 110 with data that is valid. As part of correcting the one or more errors, the ECC engine may identify error data, such as an address (e.g., a page address), corresponding to a location of the error. Accordingly, the error data may represent an occurrence of the one or more errors in data read from the location of the memory 382 based on the physical address (e.g., that corresponds to an intermediate address (i_addr)). The error data may be provided to the host device 110 from the memory device 380. For example, the error data may be included with data accessed from the location corresponding to the physical address (p_addr). As another example, the error data may be stored in a mode register of the memory device 380 that is accessible to the host device 110.

The memory controller 318 may receive the data based on the particular physical address (p_addr) and the error data from the memory device 380. The memory controller 318 may provide the data, the error data, or a combination thereof to one or more of the processor 330, the remapping engine 114, or the frequency refresh controller 317. For example, the memory controller 318 may poll the mode register of the memory device 380 to determine whether the mode register includes any error data. In a particular embodiment, the memory controller 318 may periodically poll the mode register of the memory device 380, such as at a regular interval. As another example, the memory controller 318 may retrieve error data from the mode register in response to receiving a flag included with error-corrected data corresponding to the physical address (p_addr). In a particular embodiment, the memory controller 318 may retrieve the error data from the mode register responsive to a signal received from the processor 330 or the remapping engine 114.

The remapping engine 114 may receive the error data and may generate or update a log of error data information responsive to the received error data, as previously described. For example, the remapping engine 114 may generate the log in the non-volatile memory 350 associated with the host device 110. The remapping engine 114 may generate an entry in the log to record particular error data, such as recording a time associated with reception of the particular error data. The remapping engine 114 may identify a particular intermediate address (i_addr) as a remapped address and identify (e.g., designate) a corresponding physical address (p_addr) based on a number of occurrences of errors in data read satisfying a threshold.

To remap an intermediate address (i_addr) to a remapped address, the remapping engine 114 tracks pages of the memory 382. For example, the remapping engine 114 may track which of the pages are bad (e.g., faulty), reserved, or remapped, as described with reference to FIG. 5. The remapping engine 114 may be configured to select a reserved address of the memory 382 to correspond to a particular remapped intermediate address (i_addr) when the particular intermediate address (i_addr) has a number of occurrences of errors that satisfies the threshold. The remapping engine 114 may store or update the address map 352 in the non-volatile memory 350 to include remapping information that identifies the remapped intermediate address (i_addr) and a corresponding physical address (p_addr). Accordingly, if the host device 110 loses power, the non-volatile memory 350 may retain the remapping information (e.g., the remapped intermediate addresses (i_addr) and the corresponding physical address (p_addr)).

The frequency refresh controller 317 may operate to refresh the memory device 380 at a frequency (e.g., a refresh frequency) that is less than a design refresh frequency of the memory 382. For example, a manufacturer of the memory 382 may specify a frequency requirement, such as a design refresh frequency, of 15.265 Hertz (Hz) for refresh of the memory 382. The frequency refresh controller 317 may lower the refresh frequency over a period of time until a particular frequency is reached or until a number of remapped addresses is reached, such as described with reference to FIG. 6. For example, the frequency refresh controller 317 may lower a refresh rate of a cell of the memory 382, a page of the memory 382, or an entirety of the memory 382. As an illustrative example, the particular refresh frequency specified by the manufacturer may be 12 Hz and the number of remapped addresses may correspond to a percentage of memory pages of the memory 382, such as 10% of addressable pages. The frequency refresh controller 317 may control the refresh rate of the memory 382 via the memory controller 318 or, alternatively, the frequency refresh controller 317 may control the refresh rate via the interface 316 without use of the memory controller 318. For example, when the particular refresh frequency specified by the manufacturer is 12 Hz, the memory refresh controller 317 may lower the refresh rate incrementally from the particular refresh frequency of 12 Hz to a target frequency of 10 Hz. The memory refresh controller 317 may incrementally lower the refresh rate by a fixed amount (e.g., 0.1 Hz) until the target frequency is reached or until the target percentage of memory pages have been identified as failed or failing.

Alternatively or additionally, the memory refresh controller 317 may raise the refresh rate to reclaim one or more memory pages identified as failed or failing. For example, the memory refresh controller 317 may incrementally raise the refresh rate by a fixed amount until a number of memory pages have been reclaimed or until a particular frequency is reached. The remapping engine 114 may reincorporate the one or more reclaimed memory pages for use by updating a status corresponding to each of the one or more reclaimed memory pages that are tracked by the remapping engine 114. The remapping engine 114 may reincorporate a particular memory page for use by changing a particular status of the particular memory page from a first status of failed, failing, or likely to fail (e.g., unused) to a second status of reserved, as described further with reference to FIG. 5.

During operation of the system 300, the host device 110 may be turned on and the remapping engine 114 may request the address map 352, including remapping information, to be loaded from the non-volatile memory 350 into the memory address remapping circuit 120. After the memory address remapping circuit 120 receives the remapping information, the processor 330 may access the memory device 380 via the memory address remapping circuit 120. The memory address remapping circuit 120 may provide one or more physical addresses (p_addr) to the memory device 380 via the memory controller 318.

The memory controller 318 may send the one or more physical addresses (p_addr) to the memory device 380. The memory controller 318 may receive data, error data, or a combination thereof, from the memory device 380 based on the one or more physical addresses (p_addr). The data may be provided at least to the processor 330, and the error data may be provided to the processor 330, the remapping engine 114, the frequency refresh controller 317, or a combination thereof.

Based on the error data, the remapping engine 114 may determine that a location of the memory 382 is bad and may remap an intermediate address (i_addr) corresponding with the location to a different location (e.g., selected from one or more reserved locations/addresses) of the memory device that is reserved for remapping, as described with reference to FIG. 5. The remapping engine 114 may populate or update the address map 352, the memory address remapping circuit 120, or a combination thereof, to reflect the intermediate address (i_addr) being remapped. Based on the error data, the frequency refresh controller 317 may adjust (e.g., lower) a refresh rate associated with the memory 382 of the memory device 380.

Figure 5:
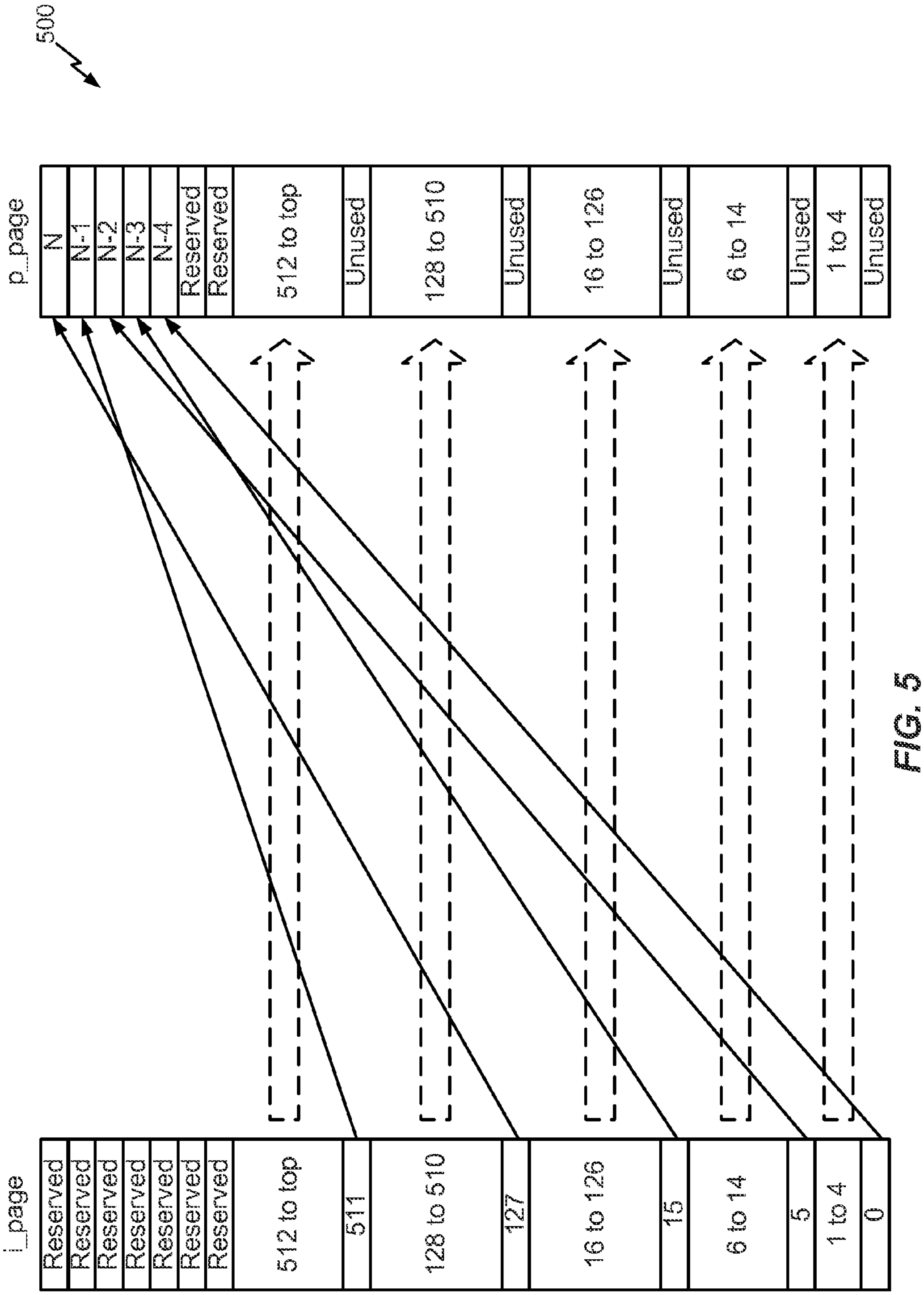
FIG. 5 is an illustrative example of remapping that may be performed by the host device of FIG. 1.

Accordingly, by remapping the intermediate address (i_addr) when bad locations are identified, the processor 330 may treat the memory 382 as a contiguous storage space even though one or more intermediate addresses (i_addr) have been remapped to one or more non-contiguous physical addresses (p_addr), as described further with reference to FIG. 5. By tracking the errors determined by the ECC engine, the host device 110 is able to identify and avoid bad locations of the memory 382. By avoiding bad location of the memory 382, data stored in the memory device 380 may have fewer errors. Additionally, by controlling a refresh frequency (e.g., a refresh rate) of the memory 382, the refresh rate may be lowered to prompt (e.g., cause) marginal functioning cells to produce errors. By identifying such cells (e.g., the marginal functioning cells) and remapping to avoid their use, the refresh rate may be decreased and errors that would be produced by the marginal functioning cells can be avoided. As a result, power used by the system 300 may be saved and an overall memory access time of the memory 382 by the processor 330 may be improved, as described with reference to FIG. 6.

Figure 4:
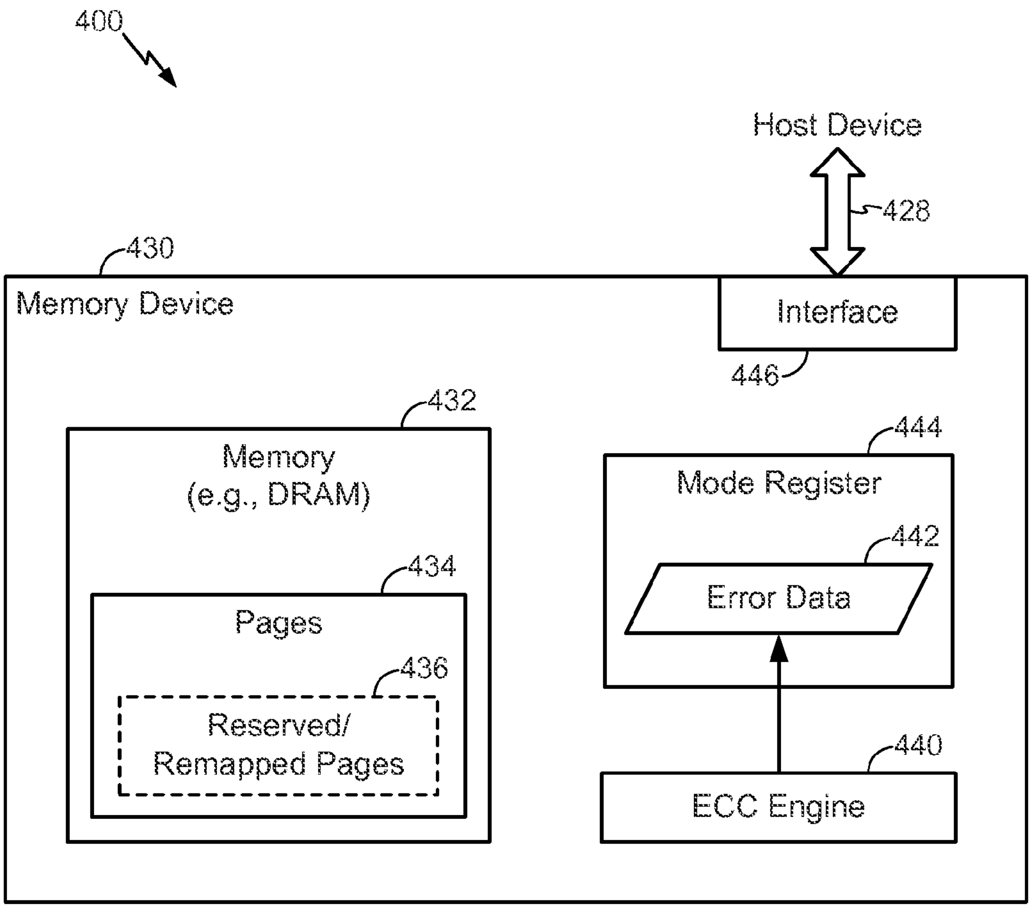
FIG. 4 is a block diagram of a first illustrative embodiment of a memory device including a mode register to store error data.

Referring to FIG. 4, a system 400 having a mode register to store error data is shown. The system 400 includes a memory device 430 that is communicatively coupled to a host device, such as the host device 110 of FIGS. 1 and 3. For example, the memory device 430 may include the memory device 380 of FIG. 3. The memory device 430 may communicate with the host device via a bus 428. Although one memory device 430 is depicted as being coupled via a bus 428, the system 400 may include multiple memory devices coupled to the bus 428.

The memory device 430 includes a memory 432, an error-correcting coding (ECC) engine 440, a mode register 444, and an interface 446. The memory device 430 may also include a processor or a controller (not shown) to control one or more operations or functions associated with the memory device 430. The memory 432 may include a random-access memory (RAM). For example, the memory 432 may include a dynamic random-access memory (DRAM), a static random-access memory (SRAM), or a magnetoresistive random-access memory (MRAM). In a particular embodiment, the memory 432 is a DRAM.

The memory 432 may include pages 434, a portion of which are reserved/remapped pages 436. The memory device 430 may receive a physical address (p_addr) from the host device via the interface 446. The memory device 430 may access a particular location of the memory 432 based on the physical address (p_addr). For example, the physical address (p_addr) may be associated with a read request to read data from the location of the memory 432 that corresponds to the physical address (p_addr). The memory device 430 may provide data stored at the location to the host device. For example, the data may be provided to an operating system or a processor of the host device.

The ECC engine 440 of the memory device 430 may be configured to detect data errors associated with the access of the memory 432 based on the physical address (p_addr). For example, the ECC engine 440 may implement a single bit error-correcting, multiple-bit error detecting code. In a particular embodiment, the ECC engine 440 is a one bit correcting and a two bit detecting error-correcting code engine. When the ECC engine 440 detects a data error associated with the access, the ECC engine 440 may correct the error so the memory device 430 is able to return valid data to the host device. As part of correcting the error, the ECC engine 440 may identify error data 442, such as an address (e.g., a column and a row of the cell storing the erroneous bit, or an address of the page that includes the cell), corresponding to the error and store the error data 442 in the mode register 444. Accordingly, the error data 442 may represent an occurrence of the error in data read from the location of the memory 432 that corresponds to the physical address (p_addr).

The mode register 444 may be accessible to the host device via the interface 446, and the error data 442 stored in the mode register 444 may be provided to the host device via the bus 428. The ECC engine 440 may provide an indication to the host device that the address is stored in the mode register 444. In a particular embodiment, the ECC engine 440 provides the indication to the host device as a flag (e.g., a bit) included with the data from the location of the memory 432. When the system 400 includes the plurality of memory devices coupled to the bus 428, each memory device of the plurality of memory devices may include at least one corresponding mode register that is accessible to the host device.

During operation of the system 400, the memory device 430 may receive the physical address (p_addr) and access the memory 432 based on the physical address (p_addr). Data corresponding to the physical address (p_addr) may be retrieved and the ECC engine 440 may determine whether the data includes an error. When the ECC engine 440 identifies an error, the ECC engine 440 may correct the error and may provide error data 442, such as a particular location within the memory 432, to the mode register 444.

The host device may receive the error data 442 from the mode register 444 and may populate a log associated with the error data. Based on the log, a remapping engine, such as the remapping engine 114 of FIGS. 1 and 3, may determine that a location (e.g., a byte or word or page) of the memory 432 is failing or failed.

By storing the error data in the mode register, the memory device 430 may enable the host device to identify and avoid bad locations of the memory 432. Additionally, a frequency refresh controller, such as the frequency refresh controller 317 of FIG. 3, may adjust a refresh frequency (e.g., reduce a refresh rate) associated with the memory 432 based on the error data 442. By reducing the refresh rate, the host device may be able to realize power savings by refreshing the memory 342 less frequently.

Referring to FIG. 5, an illustrative example of remapping that may be performed by the host device 110 of FIGS. 1 and 3 is shown and generally designated 500. The remapping may be performed by a remapping engine, such as the remapping engine 114 of FIGS. 1 and 3, associated with a host device.

In FIG. 5, a number of intermediate page addresses (i_page) and a number of physical page addresses (p_page) are illustrated. The intermediate page addresses (i_page) and the physical page addresses (p_page) may be tracked by the remapping engine. For example, the remapping engine may track the intermediate page addresses (i_page) and the physical page addresses (p_page) in a data structure (e.g., a table) stored in a memory, such as the memory 340 or the non-volatile memory 350 of FIG. 3. A total number of intermediate page addresses (i_page) may correspond to a number of locations in a memory, such as the memory 432 of FIG. 4. An operating system or a processor of the host device may calculate the memory address range when the host device boots. For example, the operating system or the processor may access a contiguous group of intermediate page addresses, such as from a page zero to a top available page. The remapping engine may communicate one or more pages that have been reserved to the operating system or the processor so that the operating system or the processor does not extend the memory space beyond the address of the top available page and into the physical pages that have been reserved. The operating system or the processor of the host device may maintain or update the memory address range based on one or more signals or instructions received from the remapping engine, as described further herein.

During operation of a system, such as the system 100 of FIG. 1, or the system 300 of FIG. 3, each intermediate page address (i_page) may initially be equal to a corresponding physical page address (p_page). During operation of the system, intermediate page addresses (i_page) 0, 5, 15, 127, and 511 may be determined to correspond to bad locations in the memory. The remapping engine may remap each of the intermediate page addresses (i_page) 0, 5, 15, 127, and 511 to a different physical page address (p_page) selected from the reserved pages (as indicated in the physical page addresses (p_page)). For example, the intermediate page address (i_page) number 127 may be remapped from a first physical page address (p_page) number 127 to a second physical page address (p_page) number N. Accordingly, when the operating system or the processor requests access to the intermediate page address (i_page) number 127, the memory address remapping circuit, such as the memory address remapping circuit 120 of FIGS. 1-3, may provide the physical page address (p_page) of number N (i.e., N corresponds to the remapped intermediate page address (i_page) number 127). When the operating system or the processor of the host device requests access to the intermediate page address (i_page) number 16, the memory address remapping circuit provides a physical page address (p_page) of number 16 because intermediate page address (i_page) number 16 has not been remapped.

The remapping engine may track the pages that have been reserved and that are available to remap an intermediate page address (i_page). When a number of reserved pages that are available for remapping satisfies (e.g., is less than or equal to) a threshold value, the remapping engine may instruct the operating system or the processor to reduce a memory address range (e.g., reduce a size of the intermediate page addresses (i_page) available to the operating system or the processor). Alternatively or additionally, the remapping engine may cause a frequency refresh controller, such as the frequency refresh controller 317 of FIG. 3, to raise a refresh rate to reclaim one or more reclaimed memory pages for use that were previously identified as failed, failing, or likely to fail (e.g., unused). For example, the refresh frequency may be raised a particular amount until a particular frequency is reached, or until a number of addresses are reclaimed. The remapping engine may update a tracked status of a particular reclaimed memory page by changing the tracked status from unused to reserved. Although raising the refresh rate may cause a power consumption penalty that is experienced by the host device, such an action may be necessary to ensure that spare (reserved) pages are available so that additional failures may be remapped in real-time or near real-time.

The memory address range may be adjusted or reduced (e.g., recalculated) in response to an instruction received from the remapping engine. For example, the memory address range may be adjusted or reduced, responsive to the instruction, by a predetermined amount or by an amount included in the instruction. In a particular embodiment, the operating system or the processor of the host device maintains (e.g., updates or adjusts) the memory address range responsive to the instructions from the remapping engine. As an illustrative example, when the number of reserved pages that are available is at or below a threshold value of two, the operating system or the processor may reduce a size of the intermediate page addresses (i_page) to create five additional pages that are reserved and available for remapping. Although FIG. 5 shows that all intermediate page addresses (i_page) may be initially equal to corresponding physical page addresses (p_page), other initial mappings may be implemented. For example, another mapping may apply an offset to each intermediate page address (i_page) to map each intermediate page address (i_page) to a corresponding physical page address (p_page). As another example, an initial mapping may map intermediate page addresses (i_page) to corresponding physical page addresses (p_page) based on testing of the memory associated with production of the memory.

Figure 6:
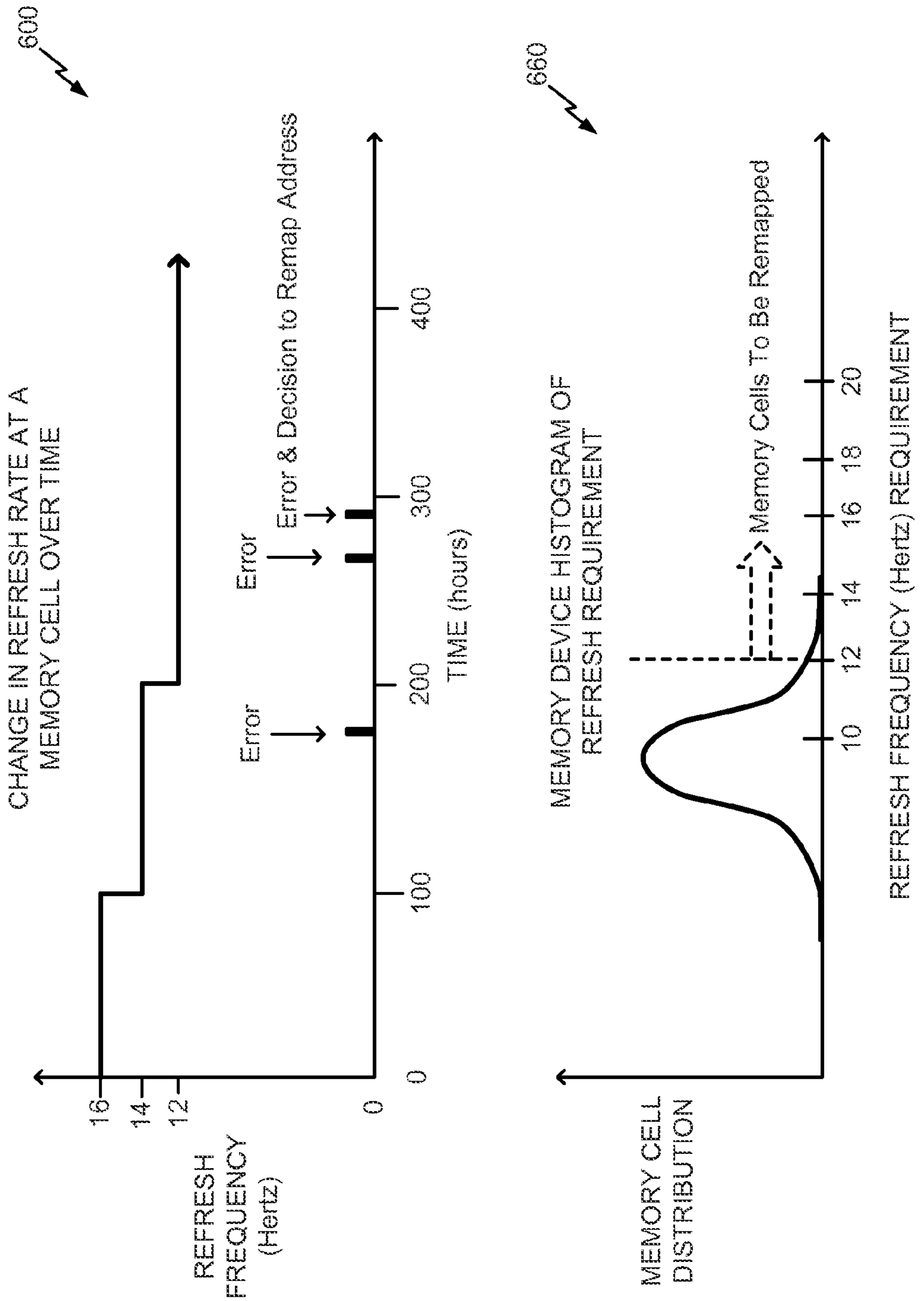
FIG. 6 is a general diagram including graphs associated with a particular embodiment of operation of a frequency refresh controller.

Referring to FIG. 6, a first graph 600 and a second graph 660 associated with a particular embodiment of operation of a frequency refresh controller are illustrated. For example, the frequency refresh controller may include the frequency refresh controller 317 of FIG. 3. The frequency refresh controller may be included in a host device, such as the host device 110 of FIGS. 1 and 3. The frequency refresh controller may control the refresh frequency of a memory, such as the memory 382 of FIG. 3 or the memory 432 of FIG. 4, over time to increase an amount of time between refreshes. Increasing the amount of time between refreshes may reduce power consumption of the host device and help identify errors in the memory, as described further herein.

A first graph 600 shows a change in refresh frequency at a memory cell (e.g., a page of the memory) over time. As shown in the first graph 600, errors associated with a particular cell may become more prevalent as the particular cell is refreshed less often. When a number of errors reaches a threshold, a remapping engine (e.g., the remapping engine 114) may remap an intermediate address (i_addr) corresponding to the memory cell, as described above, thus avoiding subsequent access to the memory cell. The frequency refresh controller may adjust the refresh rate until a target frequency is reached. For example, referring to the first graph 600, the target frequency may be 12 Hz and, after a time (e.g., 200 hours of operation), the frequency refresh controller may refrain from lowering (e.g., not lower) the refresh frequency because the refresh rate has reached the target frequency of 12 Hz.

The second graph 660 shows a memory histogram (e.g., associated with a memory, such as the memory 382 of FIG. 3 or the memory 432 of FIG. 4) of a refresh requirement (e.g., indicating a refresh rate required for each cell of the memory to retain a stored data value). As shown in the second graph 660, a mean refresh frequency of the memory cells is less than or equal to 10 Hz. Referring to the second graph 660, to operate an entirety of the memory without errors based on the refresh frequency, the entirety of the memory would have to be refreshed at or above at least 14 Hz (otherwise data values stored in some memory cells may not be maintained). Based on the second graph 660, the memory cells needing a refresh frequency above 12 Hz for reliable data storage would be expected to have errors if the refresh frequency were set to 12 Hz. Assuming the second graph 660 is representative of the memory 382 of FIG. 3 or the memory 432 of FIG. 4, if a frequency refresh controller (e.g., frequency refresh controller 317 of FIG. 3) set the refresh frequency to 12 Hz, a remapping engine (e.g., the remapping engine 114 of FIGS. 1 and 3) may identify memory cells (pages) that produce errors based on the memory cells not being refreshed frequently enough for the memory cells to retain stored data value. Once identified, the remapping engine may avoid those cells by remapping intermediate addresses (i_addr) corresponding to those memory cells.

Accordingly, by reducing the refresh rate from a first rate to a reduced rate, memory cells at a tail end of a memory cell distribution may be identified and avoided. The memory may then operate at the reduced refresh rate and consume less power as compared to operation at the recommended higher rate.

Figure 7:
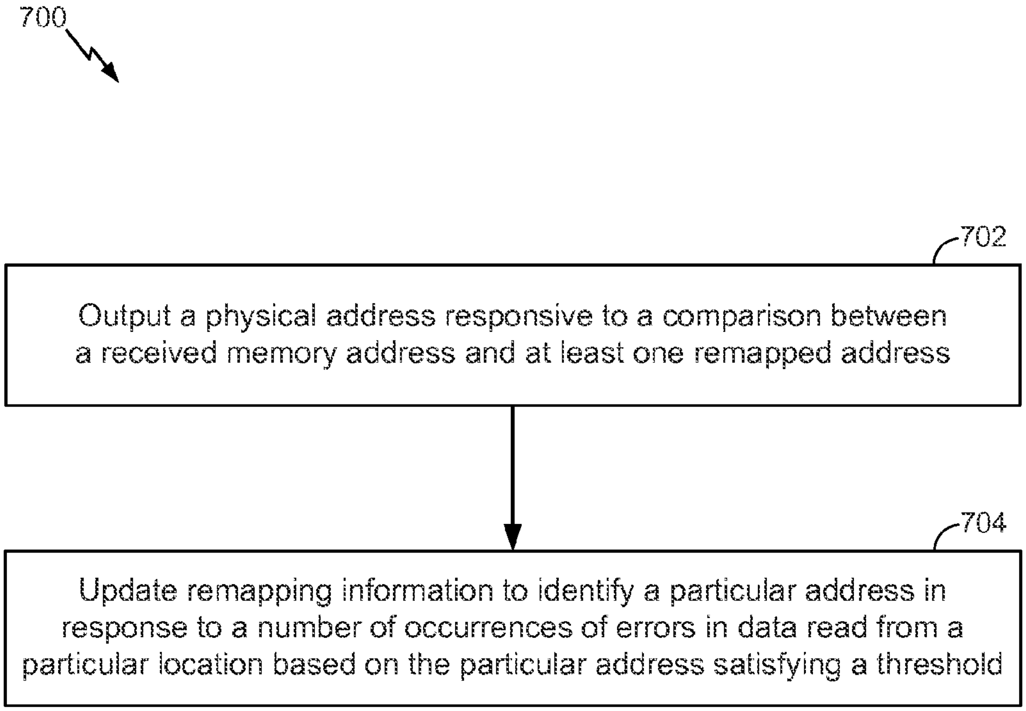
FIG. 7 is a flow diagram of an illustrative embodiment of a method of operating a host device.

Referring to FIG. 7, a particular embodiment of a method 700 of remapping a memory address is shown. For example, the remapping may be performed by one or more components of the host device 110 of FIGS. 1 and 3.

Responsive to a comparison between a received memory address and at least one remapped address, a physical address is output, at 402. The at least one remapped address may be included in one or more remapped addresses. The physical address may correspond to a location in a random-access memory (RAM). The RAM may include a dynamic random-access memory (DRAM), a static random-access memory (SRAM), or a magnetoresistive random-access memory (MRAM). For example, the RAM may include the memory 432 of FIG. 4. The physical address may be output from a memory address remapping circuit, such as the memory address remapping circuit 120 of FIGS. 1 and 2. Prior to outputting the physical address, the memory address remapping circuit may receive the memory address and perform the comparison between the received memory address and the at least one remapped address, such as the compare units 202-208 of FIG. 2.

Remapping information may be updated to identify a particular address in response to a number of occurrences of errors in data read from a particular location based on the particular address satisfying a threshold, at 404. A remapping engine, such as the remapping engine 114 of FIGS. 1 and 3, may receive information (e.g., error data) associated with errors in data read from the memory. For example, the remapping engine may receive the error data from the RAM in response to a particular physical address output by the memory address remapping circuit. The remapping engine may detect (e.g., determine) whether the number of occurrences of errors satisfies the threshold.

Thus, a method of remapping an address based on error data has been described. By remapping the address, a host device may avoid a bad location of the memory and an amount of errors that occur from accessing the memory may be limited because locations in the memory device known to result in errors are not used.

Figure 8:
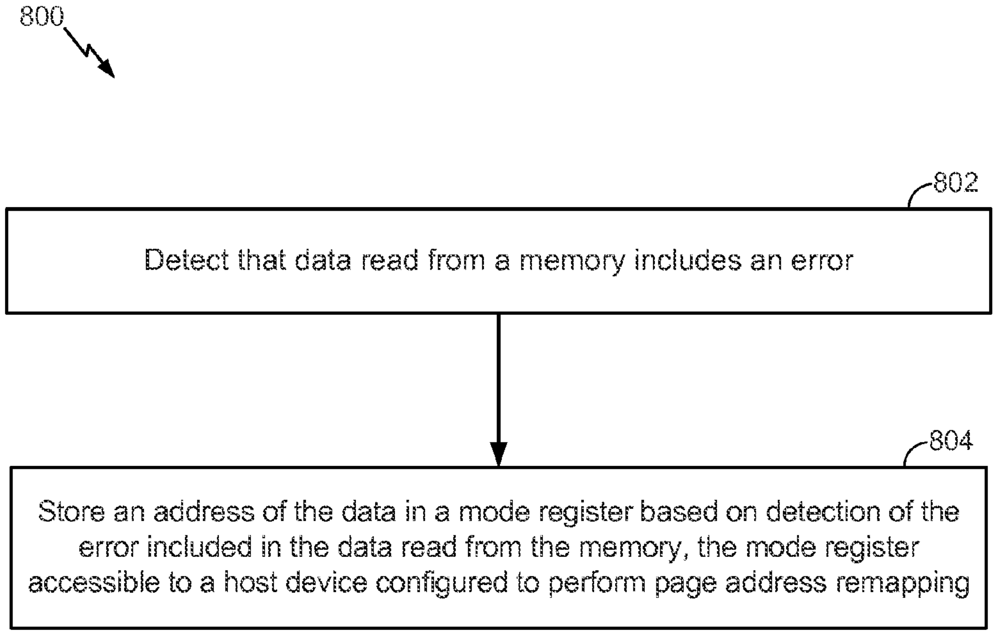
FIG. 8 is a flow diagram of an illustrative embodiment of a method of operating a memory device.

Referring to FIG. 8, a particular embodiment of a method 800 of operating a memory device is shown. For example, the memory device may include the memory device 380 of FIG. 3 or the memory device 430 of FIG. 4.

The method 800 includes detecting that data read from a memory of the memory device includes an error, at 802. The memory may include a plurality of pages, such as the pages 434 of FIG. 4. The error may be detected by an error-correcting circuitry (ECC) engine, such as the ECC engine 440 of FIG. 4.

The method 800 also includes storing an address of the data in a mode register in response to detection of the error included in the data read from the memory, at 804. The mode register may be accessible to a host device configured to perform page address remapping. The ECC engine may store the address (e.g., error data) in the mode register in response to detecting the error. For example, the mode register may correspond to the mode register 444 of FIG. 4. The address may be sent to the host device via a bus between the host device and an interface of the memory device. For example, the host device may correspond to the host device 110 of FIG. 1. In a particular embodiment, the memory device may provide an indication to the host device that the address is stored in the mode register.

Thus, a method of operating a memory device has been described. By storing the error data (e.g., the address) in the mode register, the memory device may enable the host device to identify and avoid bad locations of the memory. Additionally, a frequency refresh controller, such as the frequency refresh controller 317 of FIG. 3, may adjust a refresh frequency (e.g., reduce a rate of refresh) associated with the memory 432 based on the error data. By reducing the rate of refresh, the host device may be able to realize power savings by not refreshing the memory as frequently.

The method 700 of FIG. 7 or the method 800 of FIG. 8 may be initiated or controlled by a field-programmable gate array (FPGA) device, an application-specific integrated circuit (ASIC), a processing unit, such as a central processing unit (CPU), a digital signal processor (DSP), a controller, another hardware device, a firmware device, or any combination thereof. As an example, the method 700 of FIG. 7 or the method 800 of FIG. 8 can be initiated or controlled by one or more processors, operating systems, or controllers, such as the operating system 112 of FIG. 1, the processor 330 or memory controller 318 of FIG. 3, that executes instructions stored in a memory.

Figure 9:
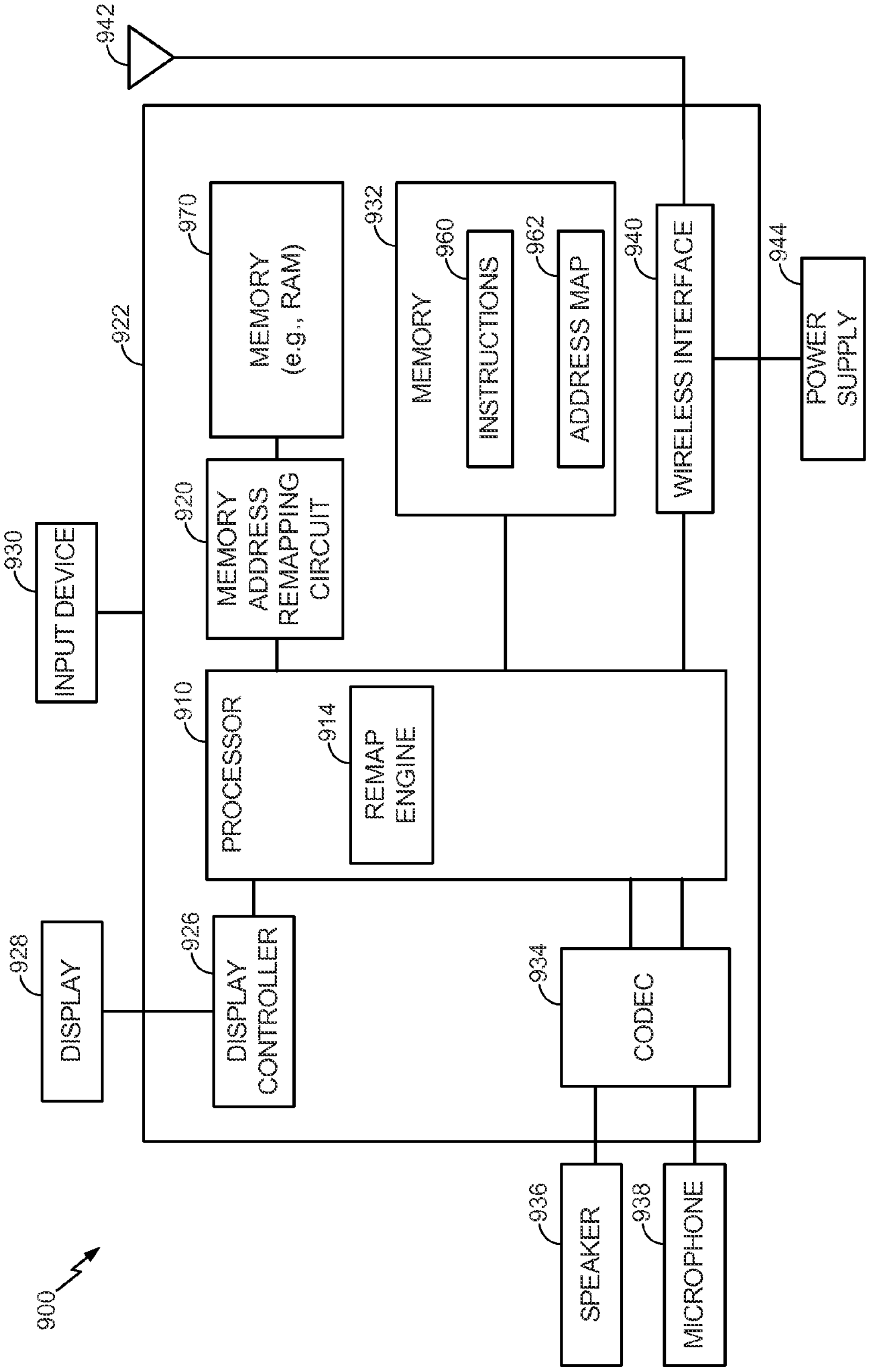
FIG. 9 is a block diagram of a device including a host device and a memory device.

Referring to FIG. 9, a block diagram of a particular illustrative embodiment of a device 900, e.g., a wireless communication device, is depicted. The device 900 may include the host device 110 of FIGS. 1 and 3, the memory device 380 of FIG. 3, or the memory device 430 of FIG. 4, as illustrative, non-limiting examples.

The device 900 includes a processor 910 coupled to a first memory 970 and to a second memory 932. The first memory 970 may include a random-access memory (RAM), such as a dynamic random-access memory (DRAM), a static random-access memory (SRAM), or a magnetoresistive random-access memory (MRAM). For example, the first memory 970 may include the memory 382 of FIG. 3 or the memory 432 of FIG. 4. Although the device 900 is illustrated as including the first memory 970, in other embodiments the first memory 970 may be external to the device 900 and may be included within a memory device, such as the memory device 380 of FIG. 3 or the memory device 430 of FIG. 4. The second memory 932 may include the memory 340, the non-volatile memory 350, or the memory 382 of FIG. 3, or the memory 432 of FIG. 4.

The processor 910 may include a remapping engine 914, such as the remapping engine 114 of FIGS. 1 and 3. The processor 910 may be configured to execute one or more instructions 960 (e.g., software or a program) stored in the second memory 932. For example, the processor 910 may include or be associated with the operating system 112 of FIG. 1 or the processor 330 of FIG. 3. The instructions 960 (e.g., executable instructions) may include computer-readable instructions or processor-readable instructions that are executable by a computer or processor.

In a particular embodiment, the processor 910 may be configured to operate in accordance with at least a portion of any of the method 700 of FIG. 7, the method 800 of FIG. 8, or any combination thereof. The processor 910 may be configured to access the first memory 970 via the memory address remapping circuit 920. For example, the memory address remapping circuit 920 may include the memory address remapping circuit 120 of FIGS. 1-3.

The second memory 932 may also include an address map 962. For example, the address map 962 may correspond to the address map 352 of FIG. 3. The address map 962 may be accessible to the remapping engine 914, the processor 910, the memory address remapping circuit 920, or a combination thereof.

In a particular embodiment, the processor 910 may be configured to execute computer executable instructions (e.g., the instructions 960) stored at a storage medium or other non-transitory computer-readable medium, such as the second memory 932. The instructions are executable to cause a computer, such as the processor 910, to perform at least a portion of any of the method 700 of FIG. 7, the method 800 of FIG. 8, or any combination thereof. For example, the computer executable instructions may be executable to cause the processor to output a physical address responsive to comparing a received memory address to at least one remapped address. The physical address corresponds to a location in a random-access memory (RAM). The computer executable instructions (e.g., the instructions 960) are further executable to cause the processor 910 to update remapping information to include (e.g., identify) the particular address in response to a number of occurrences of errors in data read from a particular location based on the particular address satisfying a threshold. In a particular embodiment, the computer executable instructions (e.g., the instructions 960) are further executable to cause the processor 910 to receive multiple memory addresses (based on a contiguous memory space, such as the memory address range of the intermediate page addresses (i_page) maintained by the operating system or the processor as described with reference to FIG. 5) from an operating system and to map the multiple memory addresses to a set of corresponding non-contiguous physical addresses in a memory (e.g., physical page addresses (p_page) of the memory as described with reference to FIG. 5).

As another example, the computer executable instructions may be executable to cause a processor or a controller included in the memory 970 to detect that data read from a memory includes an error. The computer executable instructions (e.g., instructions stored at the memory 970 and executable by the processor or the controller included in the memory 970) are further executable to cause the processor or the controller included in the memory 970 to store an address of the data in a mode register based on detection of the error included in the data read from the memory. The mode register is accessible to a host device, e.g., the processor 910 and the memory address remapping circuit 920, configured to perform page address remapping.

FIG. 9 also shows a display controller 926 that is coupled to the processor 910 and to a display 928. A coder/decoder (CODEC) 934 can also be coupled to the processor 910. A speaker 936 and a microphone 938 can be coupled to the CODEC 934. Additionally, the device 900 may include one or more controllers (not shown), such as the memory controller 318 or the frequency refresh controller 317 of FIG. 3.

FIG. 9 also indicates that a wireless interface 940 can be coupled to the processor 910 and to an antenna 942. In a particular embodiment, the processor 910, the display controller 926, the memory address remapping circuit 920, the first memory 970, the second memory 932, the CODEC 934, and the wireless interface 940 are included in a system-in-package or system-on-chip device 922. In a particular embodiment, an input device 930 and a power supply 944 are coupled to the system-on-chip device 922. Moreover, in a particular embodiment, as illustrated in FIG. 9, the display 928, the input device 930, the speaker 936, the microphone 938, the antenna 942, and the power supply 944 are external to the system-on-chip device 922. However, each of the display 928, the input device 930, the speaker 936, the microphone 938, the antenna 942, and the power supply 944 can be coupled to a component of the system-on-chip device 922, such as an interface or a controller.

One or more of the disclosed embodiments may be implemented in a system or an apparatus, such as the device 900, that may include a communications device, a fixed location data unit, a mobile location data unit, a mobile phone, a cellular phone, a satellite phone, a computer, a tablet computer, a portable computer, or a desktop computer. Additionally, the device 900 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof. As another illustrative, non-limiting example, the system or the apparatus may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof.

Figure 10:
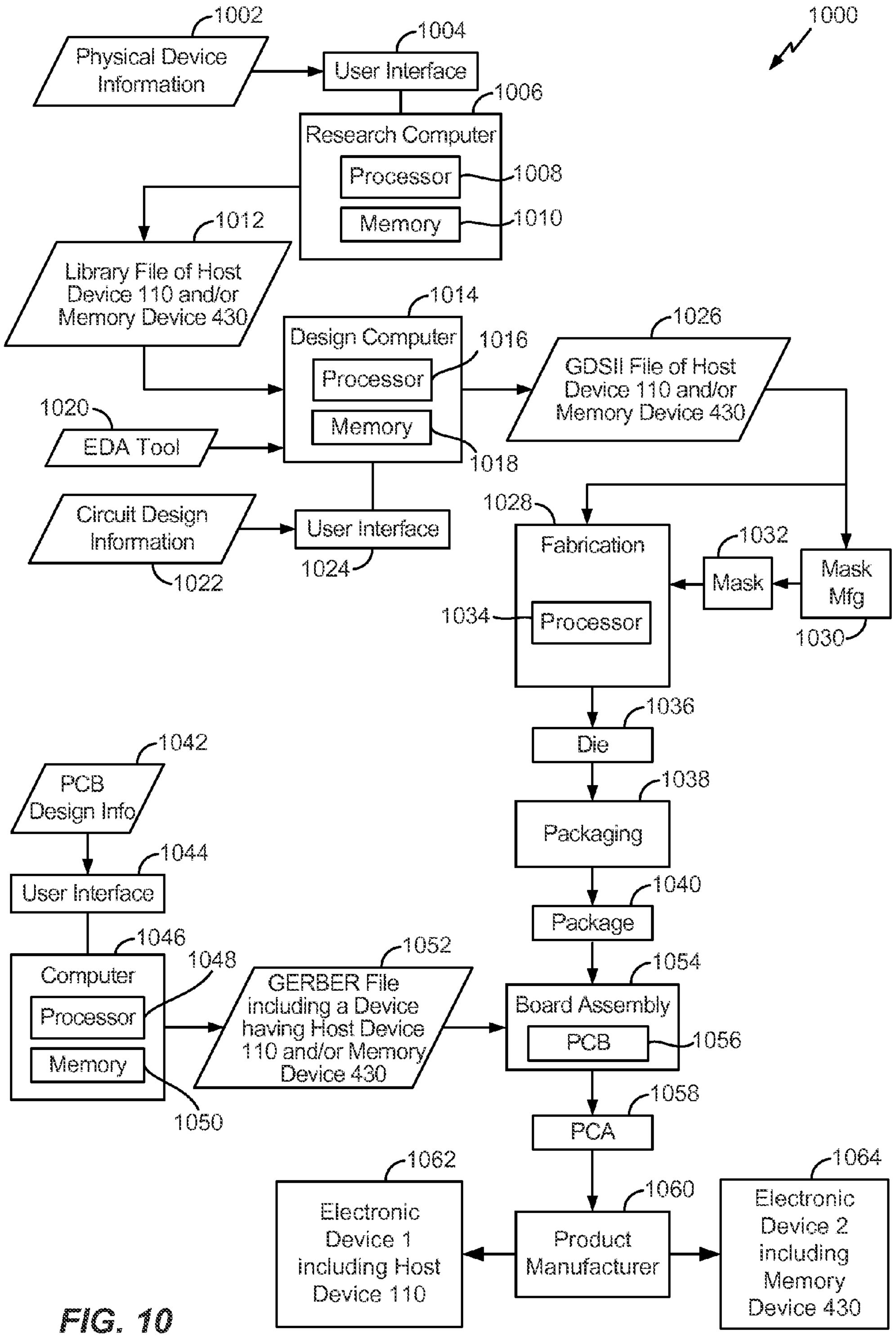
FIG. 10 is a data flow diagram of a particular illustrative embodiment of a manufacturing process of a device including a host device, a memory device, or a combination thereof.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 10 depicts a particular illustrative embodiment of an electronic device manufacturing process 1000.

Physical device information 1002 is received at the manufacturing process 1000, such as at a research computer 1006. The physical device information 1002 may include design information representing at least one physical property of a semiconductor device, such as the host device 110 of FIGS. 1 and 3, the memory device 380 of FIG. 3, the memory device 430 of FIG. 4, or any combination thereof. For example, the physical device information 1002 may include physical parameters, material characteristics, and structure information that is entered via a user interface 1004 coupled to the research computer 1006. The research computer 1006 includes a processor 1008, such as one or more processing cores, coupled to a computer readable medium such as a memory 1010. The memory 1010 may store computer readable instructions that are executable to cause the processor 1008 to transform the physical device information 1002 to comply with a file format and to generate a library file 1012.

In a particular embodiment, the library file 1012 includes at least one data file including the transformed design information. For example, the library file 1012 may include a library of semiconductor devices including a device that includes the host device 110 of FIGS. 1 and 3, the memory device 380 of FIG. 3, the memory device 430 of FIG. 4, or any combination thereof, that is provided for use with an electronic design automation (EDA) tool 1020.

The library file 1012 may be used in conjunction with the EDA tool 1020 at a design computer 1014 including a processor 1016, such as one or more processing cores, coupled to a memory 1018. The EDA tool 1020 may be stored as processor executable instructions at the memory 1018 to enable a user of the design computer 1014 to design a circuit including the host device 110 of FIGS. 1 and 3, the memory device 380 of FIG. 3, the memory device 430 of FIG. 4, or any combination thereof, of the library file 1012. For example, a user of the design computer 1014 may enter circuit design information 1022 via a user interface 1024 coupled to the design computer 1014. The circuit design information 1022 may include design information representing at least one physical property of a semiconductor device, such as the host device 110 of FIGS. 1 and 3, the memory device 380 of FIG. 3, the memory device 430 of FIG. 4, or any combination thereof. To illustrate, the circuit design information 1022 may include identification of particular circuits and relationships to other elements in a circuit design, positioning information, feature size information, interconnection information, or other information representing a physical property of a semiconductor device.

The design computer 1014 may be configured to transform the design information, including the circuit design information 1022, to comply with a file format. To illustrate, the file formation may include a database binary file format representing planar geometric shapes, text labels, and other information about a circuit layout in a hierarchical format, such as a Graphic Data System (GDSII) file format. The design computer 1014 may be configured to generate a data file including the transformed design information, such as a GDSII file 1026 that includes information describing the host device 110 of FIGS. 1 and 3, the memory device 380 of FIG. 3, the memory device 430 of FIG. 4, or any combination thereof, in addition to other circuits or information. To illustrate, the data file may include information corresponding to a system-on-chip (SOC) that includes the host device 110 of FIGS. 1 and 3, the memory device 380 of FIG. 3, the memory device 430 of FIG. 4, and that also includes additional electronic circuits and components within the SOC.

The GDSII file 1026 may be received at a fabrication process 1028 to manufacture the host device 110 of FIGS. 1 and 3, the memory device 380 of FIG. 3, the memory device 430 of FIG. 4, or any combination thereof, according to transformed information in the GDSII file 1026. For example, a device manufacture process may include providing the GDSII file 1026 to a mask manufacturer 1030 to create one or more masks, such as masks to be used with photolithography processing, illustrated as a representative mask 1032. The mask 1032 may be used during the fabrication process to generate one or more wafers 1034, which may be tested and separated into dies, such as a representative die 1036. The die 1036 includes a circuit including a device that includes the host device 110 of FIGS. 1 and 3, the memory device 380 of FIG. 3, the memory device 430 of FIG. 4, or any combination thereof.

The die 1036 may be provided to a packaging process 1038 where the die 1036 is incorporated into a representative package 1040. For example, the package 1040 may include the single die 1036 or multiple dies, such as a system-in-package (SiP) arrangement. The package 1040 may be configured to conform to one or more standards or specifications, such as Joint Electron Device Engineering Council (JEDEC) standards.

Information regarding the package 1040 may be distributed to various product designers, such as via a component library stored at a computer 1046. The computer 1046 may include a processor 1048, such as one or more processing cores, coupled to a memory 1050. A printed circuit board (PCB) tool may be stored as processor executable instructions at the memory 1050 to process PCB design information 1042 received from a user of the computer 1046 via a user interface 1044. The PCB design information 1042 may include physical positioning information of a packaged semiconductor device on a circuit board, the packaged semiconductor device corresponding to the package 1040 including the host device 110 of FIGS. 1 and 3, the memory device 380 of FIG. 3, the memory device 430 of FIG. 4, or any combination thereof.

The computer 1046 may be configured to transform the PCB design information 1042 to generate a data file, such as a GERBER file 1052 with data that includes physical positioning information of a packaged semiconductor device on a circuit board, as well as layout of electrical connections such as traces and vias, where the packaged semiconductor device corresponds to the package 1040 including the host device 110 of FIGS. 1 and 3, the memory device 380 of FIG. 3, the memory device 430 of FIG. 4, or any combination thereof. In other embodiments, the data file generated by the transformed PCB design information may have a format other than a GERBER format.

The GERBER file 1052 may be received at a board assembly process 1054 and used to create PCBs, such as a representative PCB 1056, manufactured in accordance with the design information stored within the GERBER file 1052. For example, the GERBER file 1052 may be uploaded to one or more machines to perform various steps of a PCB production process. The PCB 1056 may be populated with electronic components including the package 1040 to form a representative printed circuit assembly (PCA) 1058.

The PCA 1058 may be received at a product manufacture process 1060 and integrated into one or more electronic devices, such as a first representative electronic device 1062 and a second representative electronic device 1064. As an illustrative, non-limiting example, the first representative electronic device 1062, the second representative electronic device 1064, or both, may be selected from the group of a set top box, a music player, a video player, an entertainment unit, a navigation device, a communications device, a personal digital assistant (PDA), a fixed location data unit, and a computer, into which the host device 110 of FIGS. 1 and 3, the memory device 380 of FIG. 3, the memory device 430 of FIG. 4, or a combination thereof, is integrated. In a particular embodiment, the first representative electronic device 1062 includes the host device 110 of FIG. 1 or 3 and the second representative electronic device 1064 includes the memory device 380 of FIG. 3 or the memory device 430 of FIG. 4. As another illustrative, non-limiting example, one or more of the electronic devices 1062 and 1064 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 10 illustrates remote units according to teachings of the disclosure, the disclosure is not limited to these exemplary illustrated units. Embodiments of the disclosure may be suitably employed in any device which includes active integrated circuitry including memory and on-chip circuitry.

A device that includes the host device 110 of FIGS. 1 and 3, the memory device 380 of FIG. 3, the memory device 430 of FIG. 4, or any combination thereof, may be fabricated, processed, and incorporated into an electronic device, as described in the illustrative process 1000. One or more aspects of the embodiments disclosed with respect to FIGS. 1-9 may be included at various processing stages, such as within the library file 1012, the GDSII file 1026, and the GERBER file 1052, as well as stored at the memory 1010 of the research computer 1006, the memory 1018 of the design computer 1014, the memory 1050 of the computer 1046, the memory of one or more other computers or processors (not shown) used at the various stages, such as at the board assembly process 1054, and also incorporated into one or more other physical embodiments such as the mask 1032, the die 1036, the package 1040, the PCA 1058, other products such as prototype circuits or devices (not shown), or any combination thereof. Although various representative stages of production from a physical device design to a final product are depicted, in other embodiments fewer stages may be used or additional stages may be included. Similarly, the process 1000 may be performed by a single entity or by one or more entities performing various stages of the process 1000.

In conjunction with one or more of the described embodiments, an apparatus is disclosed that may include means for outputting a physical address responsive to a comparison between a received memory address and at least one remapped address. The physical address corresponds to a location in a random-access memory (RAM). The means for outputting may correspond to the memory address remapping circuit 120 of FIGS. 1-3, the selection circuit 124 of FIGS. 1 and 2, the selector 210 of FIG. 2, one or more other devices or circuits configured to output the physical address, or any combination thereof.

The apparatus may also include means for updating remapping information to identify a particular address in response to a number of occurrences of errors in data read from a particular location based on the particular address satisfying a threshold. The means for updating may correspond to the remapping engine 114 of FIGS. 1 and 3, one or more other devices or circuits configured to update the remapping information, or any combination thereof.

In a particular embodiment, the apparatus further includes means for comparing the received memory address to the at least one remapped address. The means for comparing may correspond to the memory address remapping circuit 120 of FIGS. 1-3, the comparison circuit 122 of FIGS. 1 and 2, the compare units 202-208 of FIG. 2, one or more other devices or circuits configured to compare the received memory address to the at least one remapped address, or any combination thereof.

In a particular embodiment, the apparatus further includes means for detecting that the occurrence of errors satisfies the threshold. The means for detecting may correspond to the remapping engine 114 of FIGS. 1 and 3, one or more other devices or circuits configured to detect that the occurrence of errors satisfies the threshold, or any combination thereof.

In conjunction with one or more of the described embodiments, an apparatus is disclosed that may include means for detecting that data read from the memory includes an error. The memory comprising a plurality of pages. The means for detecting may correspond to the ECC engine 440 of FIG. 4, one or more other devices or circuits configured to detect that the data read include the error, or any combination thereof.

The apparatus may also include means for storing an address associated with the data based on detection of the error included in the data read from the memory. The means for storing is accessible to a host device configured to perform page address remapping. The means for storing may correspond to the mode register 444 of FIG. 4, one or more other devices or circuits configured to store an address, or any combination thereof.

In conjunction with the described embodiments, a method is disclosed that may include a step for outputting a physical address responsive to a comparison between a received memory address and at least one remapped address of one or more remapped addresses, such as described in the method 700 of FIG. 7 at 702, one or more other processes configured to output the physical address responsive to the comparison, or any combination thereof. The method may also include a step for updating remapping information to identify a particular address in response to a number of occurrences of errors in data read from a particular location based on the particular address satisfying a threshold, such as described in the method 700 of FIG. 7 at 704, one or more other processes configured to update the one or more remapped addresses to identify the particular address, or any combination thereof.

Although one or more of FIGS. 1-10 may illustrate systems, apparatuses, and/or methods according to the teachings of the disclosure, the disclosure is not limited to these illustrated systems, apparatuses, and/or methods. Embodiments of the disclosure may be suitably employed in any device that includes integrated circuitry including memory, a processor, and on-chip circuitry.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A device comprising:

memory address remapping circuitry comprising:

a comparison circuit to compare a received memory address to one or more remapped addresses; and a selection circuit responsive to the comparison circuit to output a physical address, wherein the physical address corresponds to a location in a random-access memory (RAM);

a remapping engine configured to update remapping information indicating the one or more remapped addresses to include a second address upon a determination that a number of occurrences of errors in reading data at a first address satisfies a threshold; and a frequency refresh controller configured to adjust a refresh frequency of the RAM based on a number of remapped addresses indicated by the updated remapping information.

2. The device of claim 1, wherein the RAM includes a dynamic random-access memory (DRAM), a static random-access memory (SRAM), or a magnetoresistive random-access memory (MRAM).

3. The device of claim 2, further comprising a controller, wherein the controller is configured to:

poll a mode register of the DRAM for error data;

receive the error data; and determine that the number of occurrences of errors satisfies the threshold.

4. The device of claim 2, wherein the RAM is a DRAM, and wherein the first address is associated with a reserved address of the DRAM.

5. The device of claim 1, wherein the remapping engine is further configured to generate and store an identifier associated with a remapped address.

6. The device of claim 1, wherein the refresh frequency of the RAM has an initial refresh frequency of approximately 15.625 hertz (Hz).

7. The device of claim 6, wherein the frequency refresh controller is configured to lower the refresh frequency of the RAM until a first target frequency is reached.

8. The device of claim 7, wherein the frequency refresh controller is configured to increase the refresh frequency a particular amount until a second target frequency is reached or until a number of addresses are reclaimed.

9. The device of claim 1, wherein the remapping engine is further configured to store remapping information associated with the one or more remapped addresses in a non-volatile memory.

10. The device of claim 9, further comprising a non-volatile memory.

11. The device of claim 1, wherein the memory address remapping circuitry and the remapping engine are integrated in at least one semiconductor die.

12. The device of claim 1, wherein the memory address remapping circuitry and the remapping engine are integrated into a mobile phone, a cellular phone, a portable computer, a radio, a satellite radio, a communication device, a portable music player, a portable digital video player, a navigation device, a personal digital assistant (PDA), a mobile location data unit, or a combination thereof.

13. The device of claim 1, wherein the memory address remapping circuitry and the remapping engine are integrated into a set top box, an entertainment unit, a fixed location data unit, a desktop computer, a monitor, a computer monitor, a television, a tuner, a music player, a digital music player, a video player, a digital video player, a digital video disc (DVD) player, or a combination thereof.

14. A method comprising:

outputting a physical address responsive to a comparison between a received memory address and at least one remapped address, wherein the physical address corresponds to a location in a random-access memory (RAM);

updating remapping information to identify a particular address upon a determination that a number of occurrences of errors in reading data at an address satisfies a threshold; and adjusting a refresh frequency of the RAM based on a number of remapped addresses indicated by the updated remapping information.

15. The method of claim 14, further comprising comparing the received memory address to the at least one remapped address based on upper bits of the received memory address.

16. The method of claim 14, further comprising:

detecting that the number of occurrences of errors satisfies the threshold; and in response to determining that a remapped address is remapped at a first time, generating and storing an identifier associated with the remapped address.

17. The method of claim 14, further comprising providing the remapping information from a non-volatile memory to memory address remapping circuitry.

18. The method of claim 17, wherein the remapping information includes one or more remapped addresses.

19. The method of claim 17, wherein the remapping information is accessed based on a boot of an operating system.

20. The method of claim 14, wherein the threshold is satisfied based on a count of errors corresponding to the particular address.

21. The method of claim 20, wherein the count of errors is determined from a number of received errors.

22. The method of claim 14, wherein outputting the physical address, updating the remapping information, and adjusting the refresh frequency of the RAM are performed by a processor integrated into an electronic device.

23. An apparatus comprising:

means for outputting a physical address responsive to a comparison between a received memory address and at least one remapped address, wherein the physical address corresponds to a location in a random-access memory (RAM);

means for updating remapping information to identify a particular address upon a determination that a number of occurrences of errors in reading data at an address satisfies a threshold; and means for adjusting a refresh frequency of the RAM based on a number of remapped addresses indicated by the updated remapping information.

24. The apparatus of claim 23, further comprising means for comparing the received memory address to the at least one remapped address based on upper bits of the received memory address.

25. The apparatus of claim 23, further comprising:

means for detecting that the number of occurrences of errors satisfies the threshold; and means for generating and storing an identifier associated with a remapped address in response to determining that the remapped address is remapped at a first time.

26. The apparatus of claim 23, wherein the number of occurrences of errors is associated with multiple data read operations.

27. The apparatus of claim 23, wherein the means for outputting, the means for updating, and the means for adjusting are integrated in at least one semiconductor die.

28. The apparatus of claim 23, wherein the means for outputting, the means for updating, and the means for adjusting are integrated into a mobile phone, a cellular phone, a portable computer, a radio, a satellite radio, a communication device, a portable music player, a portable digital video player, a navigation device, a personal digital assistant (PDA), a mobile location data unit, or a combination thereof.

29. The apparatus of claim 23, wherein the means for outputting, the means for updating, and the means for adjusting are integrated into a set top box, an entertainment unit, a fixed location data unit, a desktop computer, a monitor, a computer monitor, a television, a tuner, a music player, a digital music player, a video player, a digital video player, a digital video disc (DVD) player, or a combination thereof.

30. A method comprising:

a first step for outputting a physical address responsive to a comparison between a received memory address and at least one remapped address, wherein the physical address corresponds to a location in a random-access memory (RAM);

a second step for updating remapping information to identify a particular address upon a determination that a number of occurrences of errors in reading data at an address satisfies a threshold; and a third step for adjusting a refresh frequency of the RAM based on a number of remapped addresses indicated by the updated remapping information.

31. The method of claim 30, wherein the threshold is satisfied in response to each error of a number of consecutive errors being based on the particular address.

32. The method of claim 30, wherein the first step, the second step, and the third step are performed by a processor integrated into an electronic device.

33. A non-transitory computer-readable medium comprising processor-executable instructions that, when executed by a processor, cause the processor to:

output a physical address responsive to comparing a received memory address to at least one remapped address, wherein the physical address corresponds to a location in a random-access memory (RAM);

update remapping information to include a particular address upon a determination that a number of occurrences of errors in reading data at an address satisfies a threshold; and adjust a refresh frequency of the RAM based on a number of remapped addresses indicated by the updated remapping information.

34. The non-transitory computer-readable medium of claim 33, further comprising processor-executable instructions that, when executed by the processor, cause the processor to compare a portion of the received address to a corresponding portion of the at least one remapped address, wherein the portion comprises upper bits of the received address.

35. The non-transitory computer-readable medium of claim 33, further comprising processor-executable instructions that, when executed by the processor, cause the processor to:

receive multiple memory addresses from an operating system, the multiple memory addresses based on a contiguous memory space; and map the multiple memory addresses to a set of corresponding non-contiguous physical addresses in a memory.

36. The non-transitory computer-readable medium of claim 35, further comprising processor-executable instructions that, when executed by the processor, cause the processor to:

track a number of reserved addresses in the memory; and instruct an operating system to reduce a memory address range of the contiguous memory space based on the number of the reserved addresses.

37. The non-transitory computer-readable medium of claim 36, wherein the operating system is instructed to reduce the memory address range in response to the number of the reserved addresses being below a threshold value.

38. The non-transitory computer-readable medium of claim 33, wherein the processor is integrated into a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, a portable digital video player, or a combination thereof.

39. A dynamic random-access memory (DRAM) device comprising:

a memory comprising a plurality of pages, the memory having an adjustable refresh frequency;

an error-correcting code (ECC) engine configured to detect errors associated with one or more pages of the plurality of pages; and a mode register accessible to a host device via a host interface, wherein an address of data read from the memory is stored in the mode register based on the ECC engine detecting that the data includes an error, wherein the mode register is readable by a host to perform page address remapping, wherein the adjustable refresh frequency is adjustable based on a number of remapped addresses indicated by updated remapping information that corresponds to the performed page address remapping.

40. The device of claim 39, wherein the ECC engine implements a single bit correcting ECC code.

41. The device of claim 39, wherein the address stored in the mode register is accessed from the mode register by the host device.

42. The device of claim 39, wherein the host device performs the page address remapping on a page of the memory based on a plurality of errors associated with multiple read operations, the plurality of errors corresponding to the page, and wherein the adjustable refresh frequency has an initial refresh frequency of approximately 15.625 hertz (Hz).

43. The device of claim 39, wherein the memory, the ECC engine, and the mode register are integrated in at least one semiconductor die.

44. The device of claim 39, wherein the memory, the ECC engine, and the mode register are integrated into a mobile phone, a cellular phone, a portable computer, a radio, a satellite radio, a communication device, a portable music player, a portable digital video player, a navigation device, a personal digital assistant (PDA), a mobile location data unit, or a combination thereof.

45. The device of claim 39, wherein the memory, the ECC engine, and the mode register are integrated into a set top box, an entertainment unit, a fixed location data unit, a desktop computer, a monitor, a computer monitor, a television, a tuner, a music player, a digital music player, a video player, a digital video player, a digital video disc (DVD) player, or a combination thereof.

46. A method comprising:

detecting that data read from a memory includes an error, the memory comprising a plurality of pages;

storing an address of the data in a mode register based on detection of the error included in the data read from the memory, wherein the mode register is accessible to a host device configured to perform page address remapping; and adjusting a refresh frequency of the memory based on a number of remapped addresses indicated by updated remapping information that corresponds to the performed page address remapping.

47. The method of claim 46, further comprising sending the address to the host device via a bus between the host device and a host interface.

48. The method of claim 46, further comprising providing an indication to the host device that the address is stored in the mode register.

49. The method of claim 46, wherein detecting the data and storing the address are performed by a processor integrated into an electronic device.

50. A method comprising:

receiving, at a computing device, design information representing at least one physical property of a semiconductor device, the semiconductor device comprising:

memory address remapping circuitry comprising:

a comparison circuit to compare a received memory address to one or more remapped addresses; and a selection circuit responsive to the comparison circuit to output a physical address, wherein the physical address corresponds to a location in a random-access memory (RAM);

a remapping engine configured to update remapping information indicating the one or more remapped addresses to include a particular address upon a determination that a number of occurrences of errors in reading data at an address satisfies a threshold; and a frequency refresh controller configured to adjust a refresh frequency of the RAM based on a number of remapped addresses indicated by the updated remapping information;

transforming, by the computing device, the design information to comply with a file format; and generating, at the computing device, a data file including the transformed design information.

51. The method of claim 50, wherein the data file comprises a GDSII format.

52. The method of claim 50, wherein the data file comprises a GERBER format.

* * * * *